(12) United States Patent
Tamura

(10) Patent No.: US 8,519,486 B2
(45) Date of Patent: Aug. 27, 2013

(54) SEMICONDUCTOR DEVICE HAVING A PLURALITY OF PHOSPHORUS-DOPED SILICON CARBIDE LAYERS

(75) Inventor: Naoyoshi Tamura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 210 days.

(21) Appl. No.: 12/782,882

(22) Filed: May 19, 2010

(65) Prior Publication Data

US 2010/0320546 A1    Dec. 23, 2010

(30) Foreign Application Priority Data

Jun. 19, 2009  (JP) ................. 2009-146657

(51) Int. Cl.
*H01L 21/02*    (2006.01)
*H01L 31/0312*  (2006.01)
*H01L 29/66*    (2006.01)
*H01L 27/088*   (2006.01)

(52) U.S. Cl.
USPC ............ 257/408; 257/77; 257/327; 257/344; 257/396; 257/E21.054; 257/E21.056; 257/E21.057; 257/E21.06

(58) Field of Classification Search
None
See application file for complete search history.

(56) References Cited

U.S. PATENT DOCUMENTS

| 2007/0235802 | A1  | 10/2007 | Chong et al. |
| 2007/0254414 | A1* | 11/2007 | Miyanami ............... 438/149 |
| 2008/0067557 | A1* | 3/2008  | Yu et al. ................. 257/255 |
| 2008/0157119 | A1* | 7/2008  | Tsai ........................ 257/190 |
| 2008/0185612 | A1* | 8/2008  | Fukuda et al. .......... 257/190 |
| 2009/0114956 | A1  | 5/2009  | Tamura |
| 2010/0301350 | A1* | 12/2010 | Tamura et al. .......... 257/77 |

FOREIGN PATENT DOCUMENTS

| JP | 2006-216955 A  | 8/2006 |
| WO | 2006/083821 A1 | 8/2006 |

OTHER PUBLICATIONS

Definition of Sandwiched. (n. d.) Collins English Dictionary—Complete and Unabridged. (1991, 1994, 1998, 2000, 2003). Retrieved Jan. 13, 2013 from http://www.thefreedictionary.com/sandwiched.*
U.S. Office Action dated Dec. 4, 2012, issued in corresponding U.S. Appl. No. 13/419,713.

* cited by examiner

*Primary Examiner* — Michael Jung
(74) *Attorney, Agent, or Firm* — Westerman, Hattori, Daniels & Adrian, LLP

(57) ABSTRACT

A semiconductor device includes a MOS transistor, a source electrode and a drain electrode on the MOS transistor each include a first carbon doped silicon layer including carbon at a first carbon concentration and phosphorus at a first phosphorus concentration and a second carbon doped silicon layer over the first silicon carbide layer, which includes phosphorus at a second phosphorus concentration higher than the first phosphorus concentration, and which includes carbon at a second carbon concentration less than or equal to the first carbon concentration.

10 Claims, 27 Drawing Sheets

(1) C : 4keV, $3 \times 10^{15}$ cm$^{-2}$
(2) C : 4keV, $6 \times 10^{15}$ cm$^{-2}$
(3) C : 4keV, $6 \times 10^{15}$ cm$^{-2}$ → P : 6keV, $1.2 \times 10^{16}$ cm$^{-2}$

US 8,519,486 B2

SEMICONDUCTOR DEVICE HAVING A PLURALITY OF PHOSPHORUS-DOPED SILICON CARBIDE LAYERS

CROSS-REFERENCE TO RELATED APPLICATION

This application is based upon and claims the benefit of priority from the prior Japanese Patent Application No. 2009-146657, filed on Jun. 19, 2009, the entire contents of which is incorporated herein by reference.

FIELD

The present invention relates to a semiconductor device and a method for manufacturing the same.

BACKGROUND

It is known that strain is applied to a channel region under a gate electrode for the purpose of high speed operation of a MOS transistor. For example, the mobility of a carrier moving in the channel region is increased by disposing a film to apply a tensile stress in the side portion of the channel region in an NMOS transistor or by disposing a film to apply a compressive stress in the side portion of the channel region in a PMOS transistor.

It is known that recesses are disposed in source/drain regions to apply strain to the channel region and heteroepitaxial films of carbon doped Silicon ($Si_{1-y}C_y$):$0<Y<0.03$ or silicon germanium ($Si_{1-x}Ge_x$) are disposed in the recesses. In this context, "$Si_{1-y}C_y$" or "carbon doped silicon" refers to single crystalline carbon doped silicon, in which mole fraction y is from 0 to 0.025. Also, Carbon contained silicon refers to polycrystalline or amorphous carbon doped silicon layer, because mole fraction y is not defined clearly due to polycrystalline or amorphous structure.

The lattice constant of $Si_{1-y}C_y$ is smaller than that of silicon in a relaxed state. Therefore, regarding a $Si_{1-y}C_y$ film epitaxially grown based on lattice matching with a (001) face of a silicon substrate, the lattice is strained in the direction of growth and a (110) face of the side surface of the channel region is contracted in a direction perpendicular to the substrate surface.

The $Si_{1-y}C_y$ film is formed in such a way that the concentration distribution of carbon (C) becomes uniform in a film thickness direction. In order to make the concentration distribution of carbon (C) in a film thickness direction uniform, for example, monomethylsilane (MMS) in helium introduced into a reaction chamber is set at 20%.

In the case where the $Si_{1-y}C_y$ films in the source/drain regions are also formed above the surface of the channel region, it is known that the $Si_{1-y}C_y$ films are formed while a carbon gas is reduced gradually or stopped in the accumulation portions of $Si_{1-y}C_y$=above the surface. Consequently, in the source/drain regions above the channel region, the C concentration is reduced gradually or becomes almost zero with decreasing proximity to the channel region.

SUMMARY

According to an aspect of the invention, a semiconductor device includes a MOS transistor, a source electrode and a drain electrode on the MOS transistor each include a first carbon doped silicon layer including carbon at a first carbon concentration and phosphorus at a first phosphorus concentration and a second carbon doped silicon layer over the first carbon doped silicon layer, which includes phosphorus at a second phosphorus concentration higher than the first phosphorus concentration, and which includes carbon at a second carbon concentration less than or equal to the first carbon concentration.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1A:
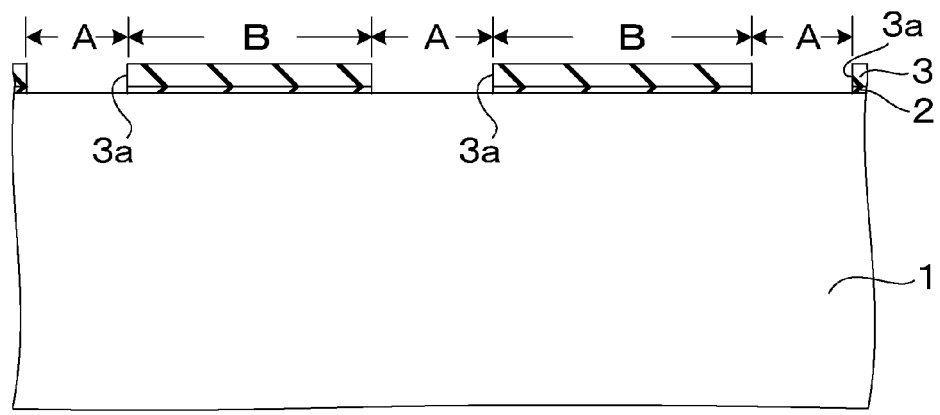
FIGS. 1A to 1X are sectional views illustrating steps of forming a semiconductor device according to a first embodiment.

The embodiments will be described with reference to the drawings. In the drawings, the same constituent elements are indicated by the same reference numerals.

Examples of methods for applying strain to a channel region include three methods.

In a first method, the distance between two epitaxial films filled in two source/drain regions is reduced. In a second method, a recess, in which an epitaxial film is filled, is made deep. In a third method, the C concentration in a $Si_{1-y}C_y$ film is made high.

In the case where the epitaxial films in the two regions are disposed closely to each other and deeply, the (110) face of the recess becomes wide and strain may increase.

Additionally, in the case where the C concentration is made high, strain increases. However, the resistance of the $Si_{1-y}C_y$ film increases as the C concentration becomes high, and the resistance between the source region and the drain region increases.

Furthermore, the energy band gap of $Si_{1-y}C_y$ is larger than the energy band gap of Si. In this regard, the energy band gap of $Si_{1-y}C_y$ further increases as the C concentration in $Si_{1-y}C_y$ becomes high. Therefore, if the C concentration of the $Si_{1-y}C_y$ film becomes high, the carrier injection efficiency at the end portion of the source region increases, but a difference in energy band gap from silicon becomes large at the end portion of the drain region and an energy barrier to movement of electrons is generated at the boundary.

As described above, two inconveniencies, that is, an increase in resistance and formation of an energy barrier, occur by increasing the C concentration of the SiC epitaxial layer.

Figure 1B:
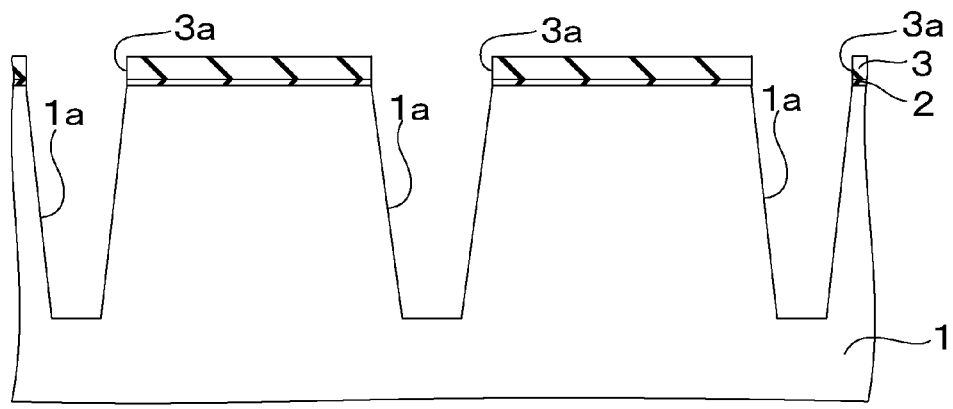
FIG. 1Y is a sectional view illustrating the semiconductor device according to the first embodiment.
Figure 1C:
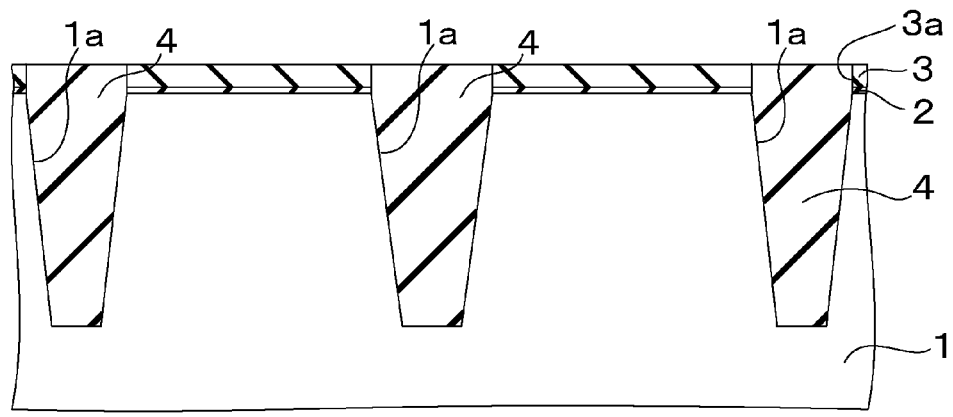
Figure 1D:
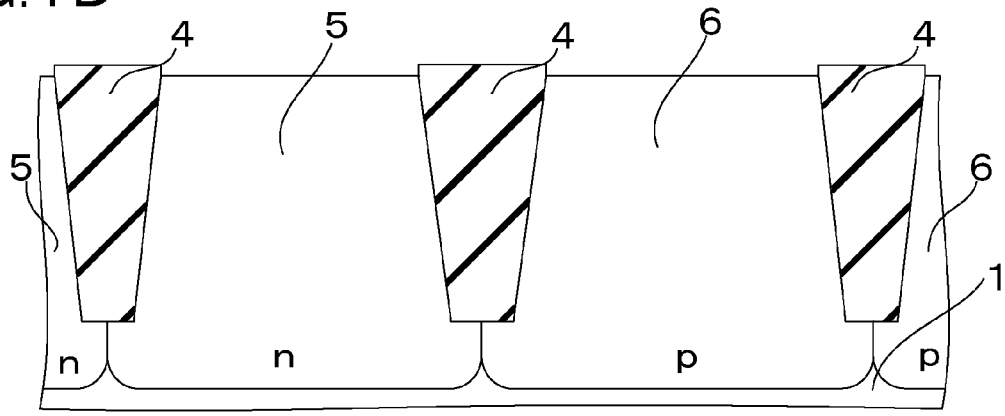
Figure 1E:
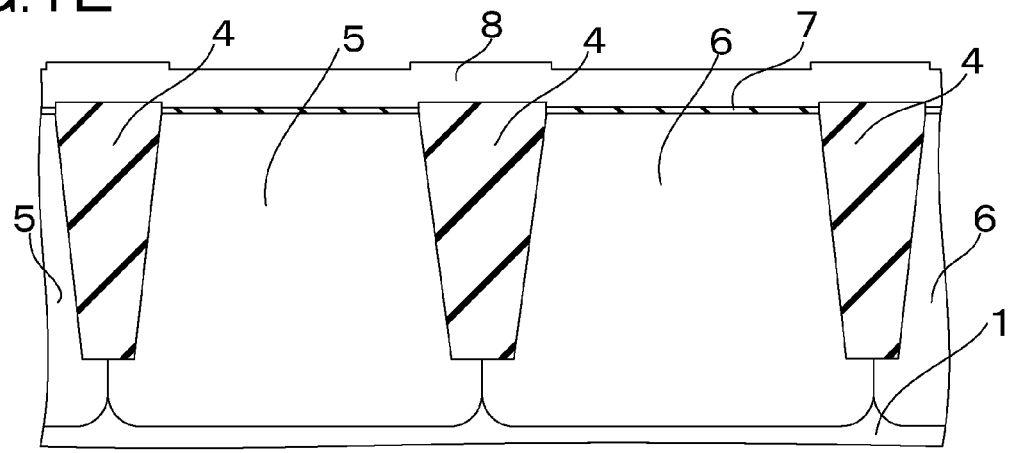
Figure 1F:
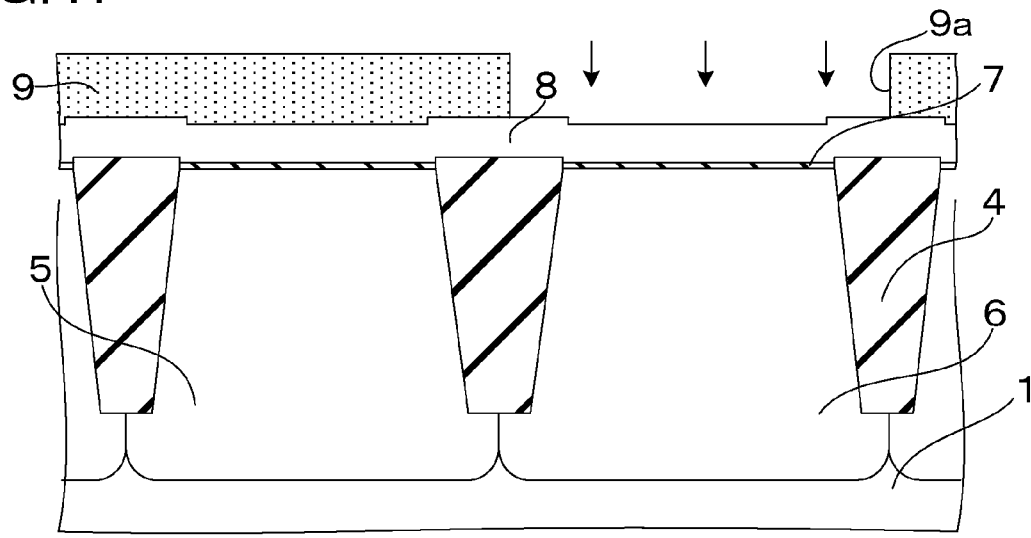
Figure 1G:
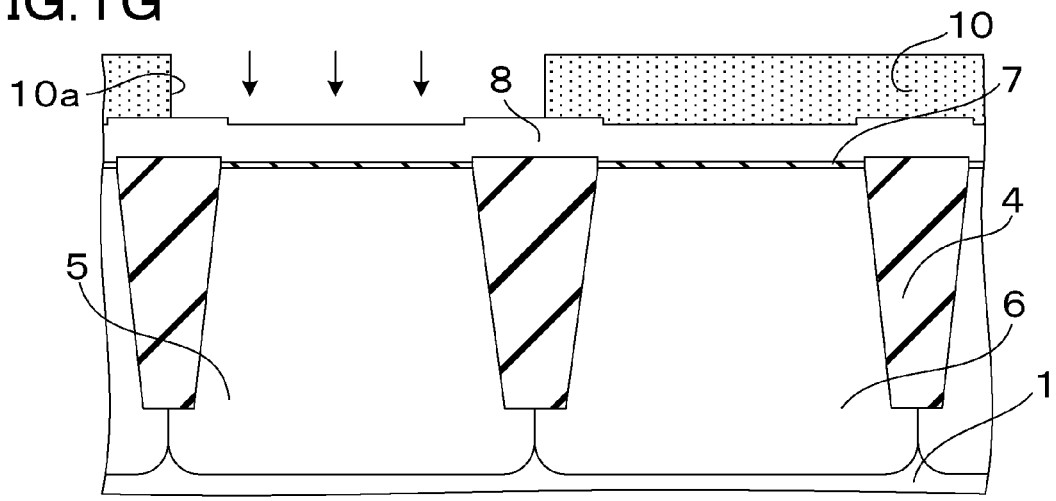
Figure 1H:
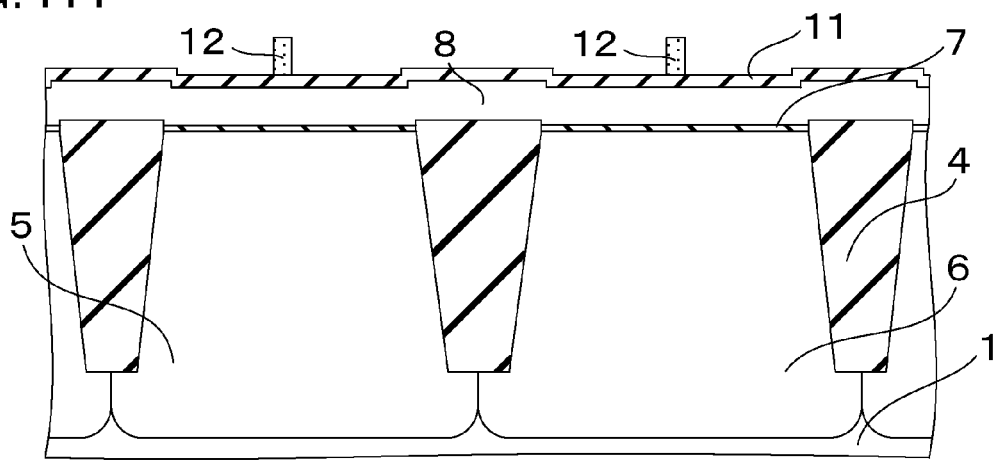
Figure 1I:
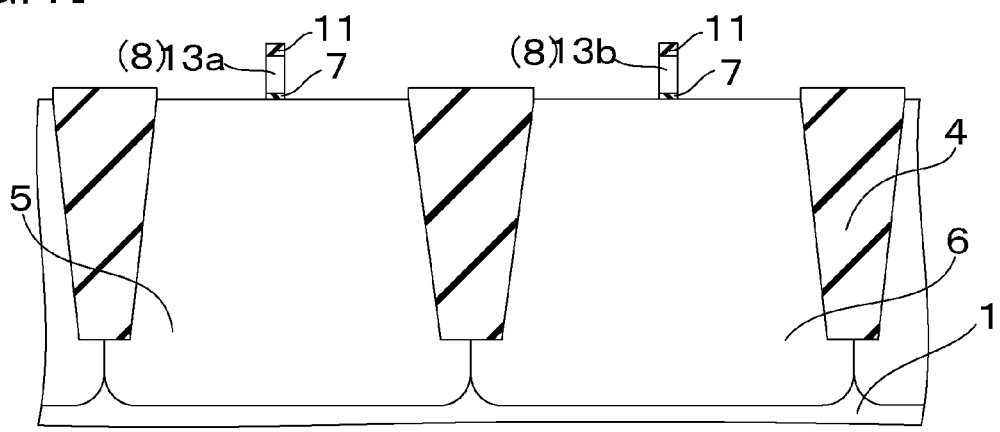
Figure 1J:
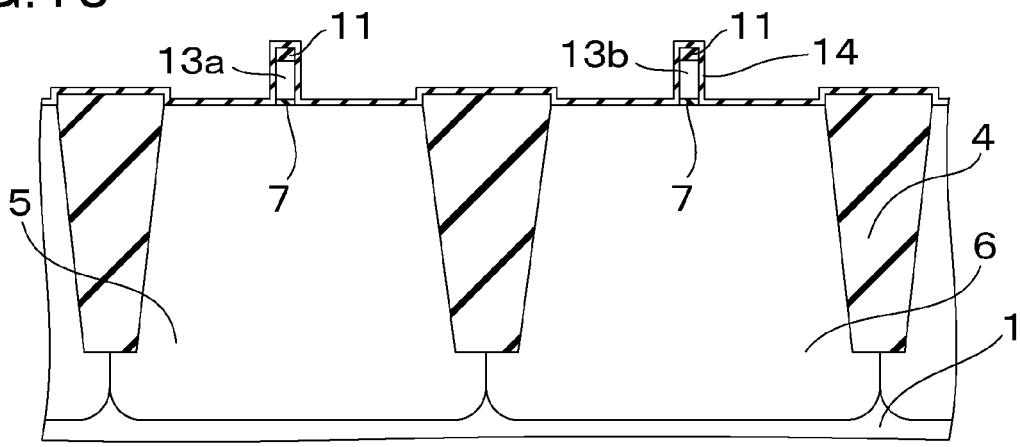
Figure 1K:
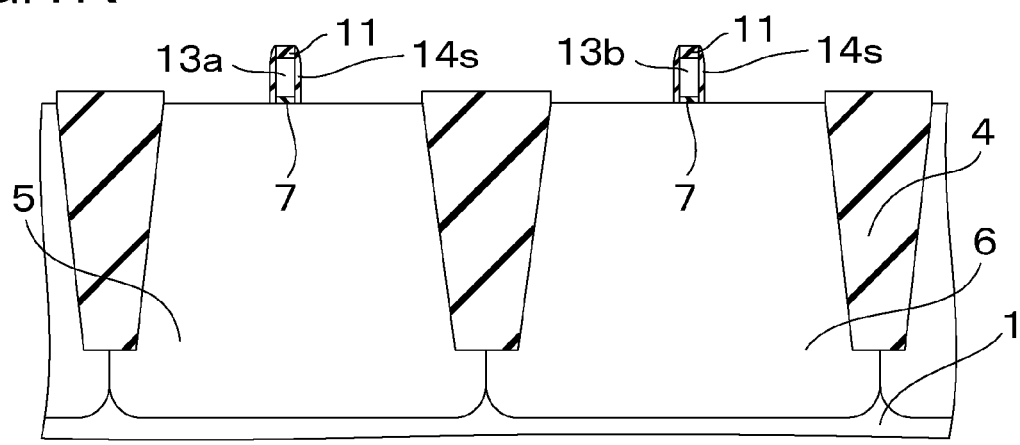
Figure 1L:
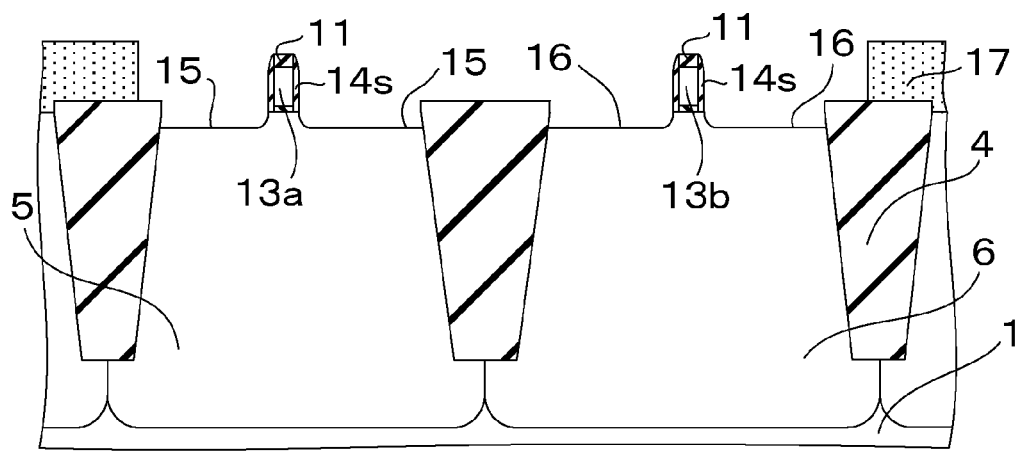
Figure 1M:
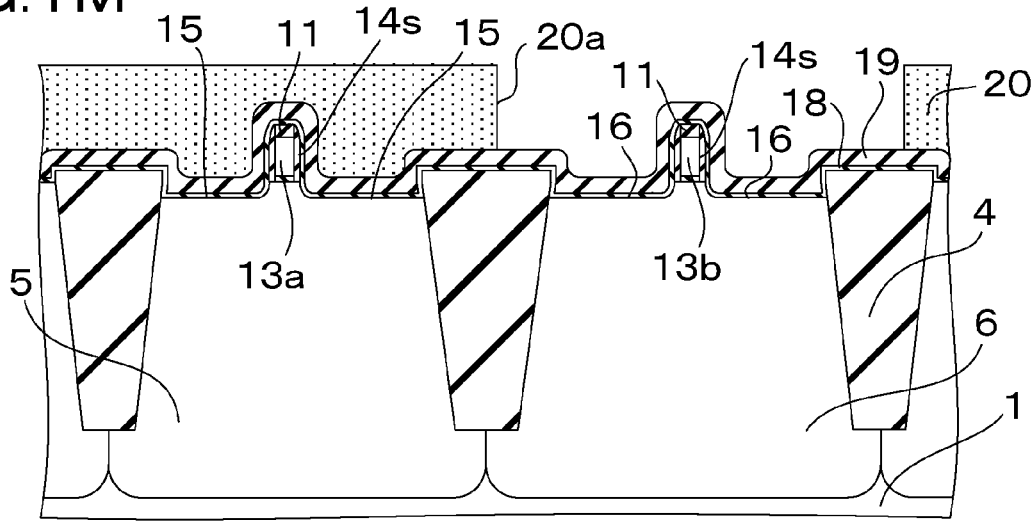
Figure 1N:
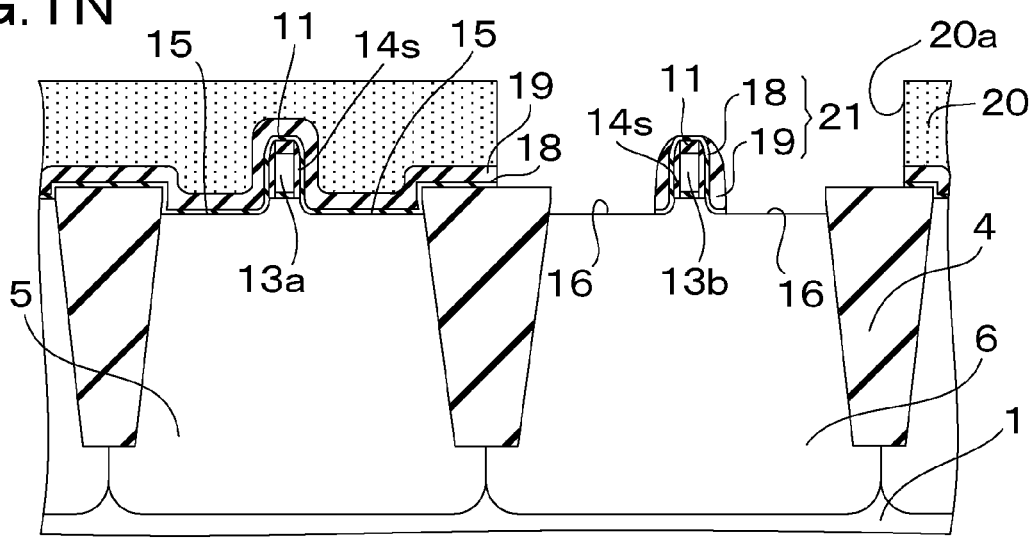
Figure 1O:
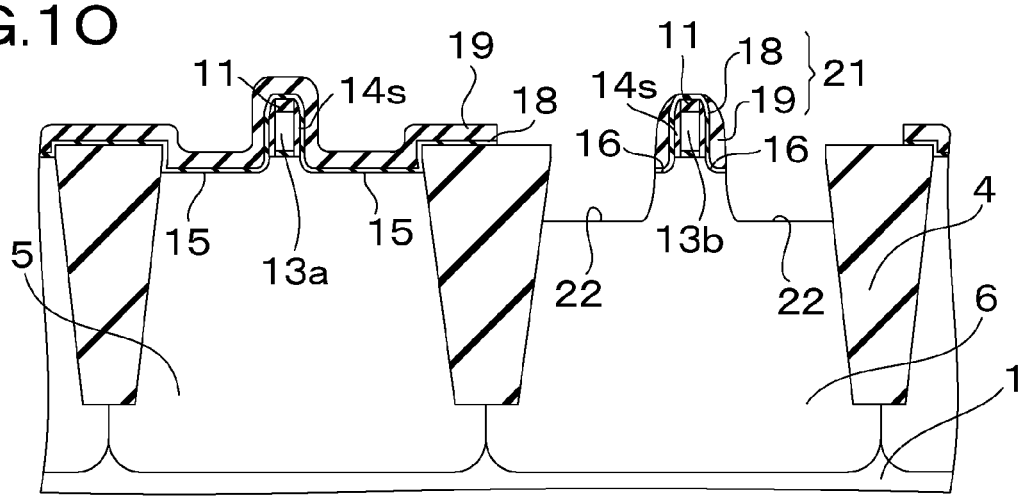
Figure 1P:
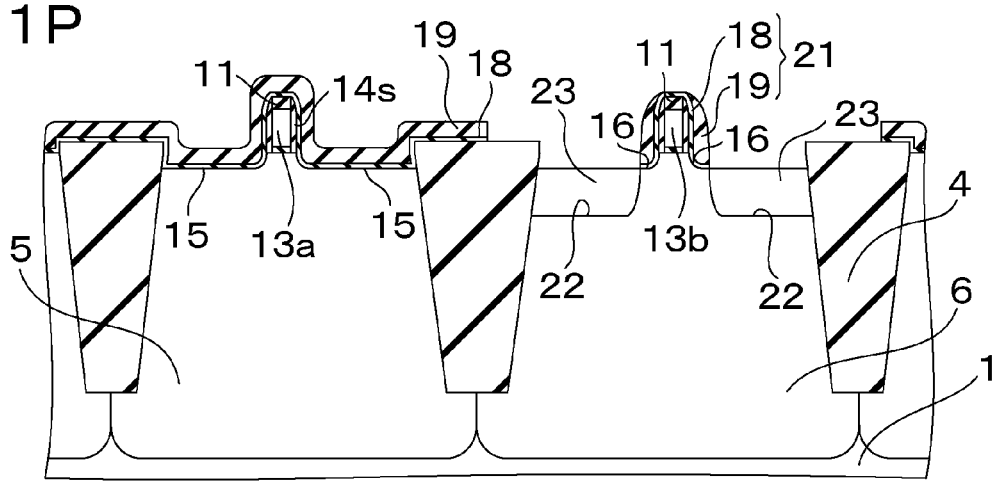
Figure 1Q:
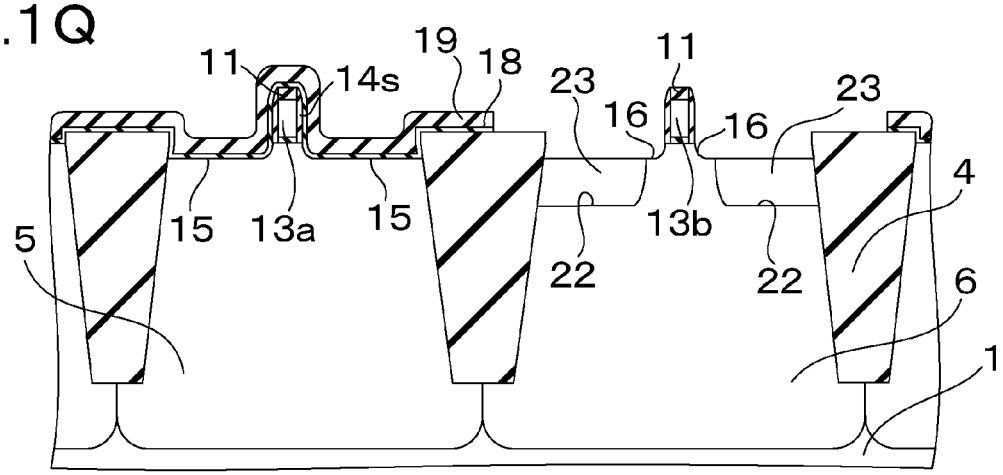
Figure 1R:
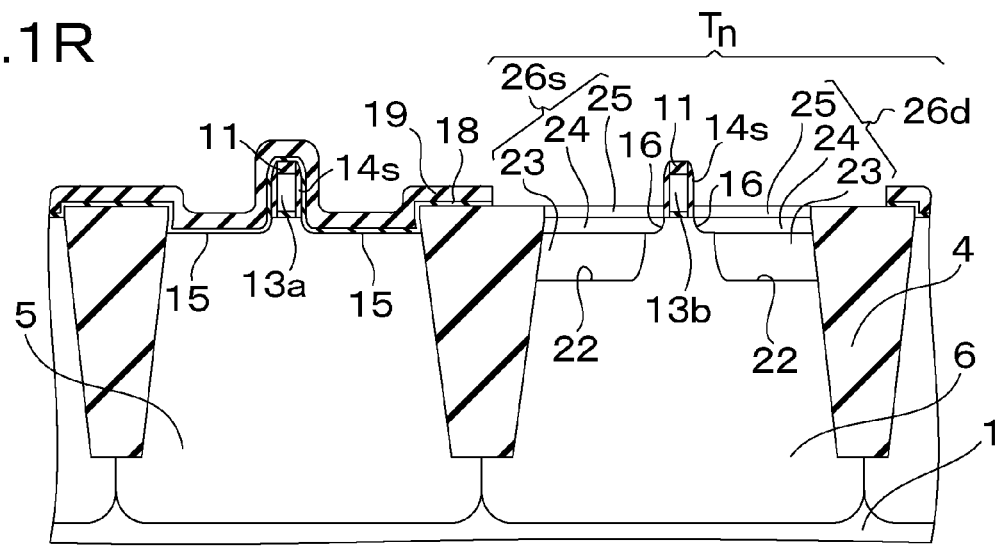
Figure 1S:
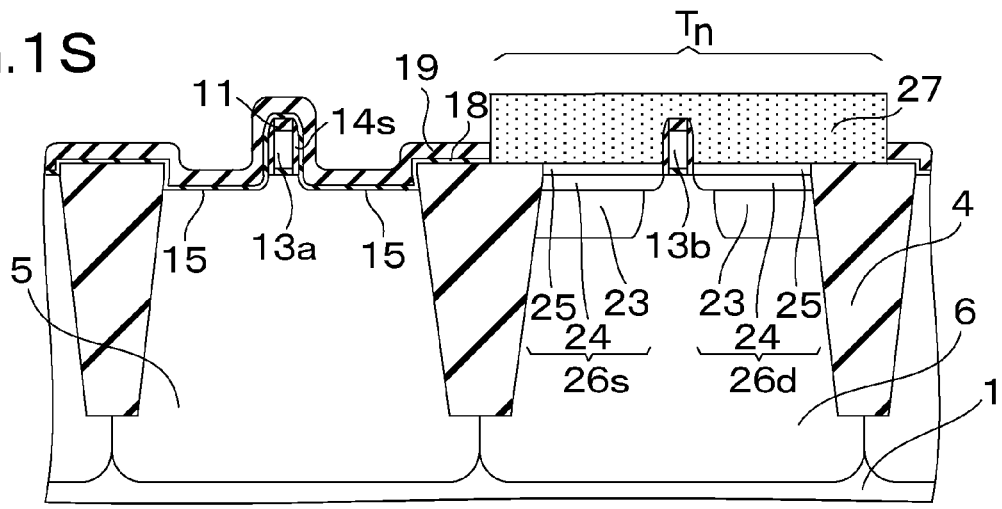
Figure 1T:
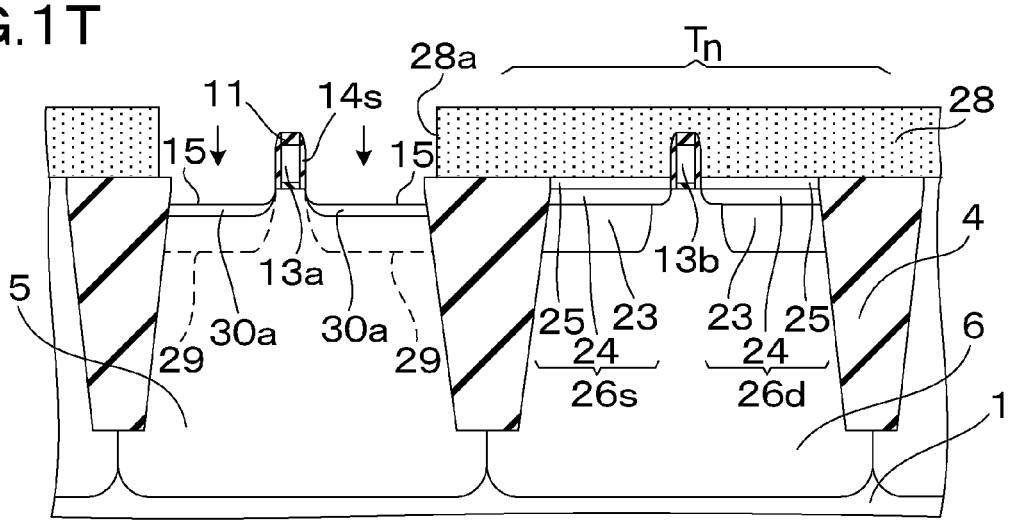
Figure 1U:
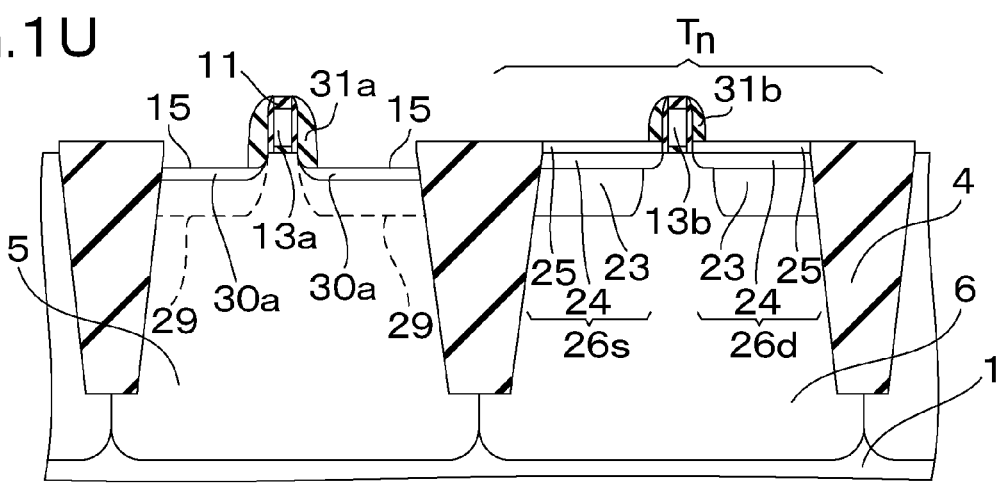
Figure 1V:
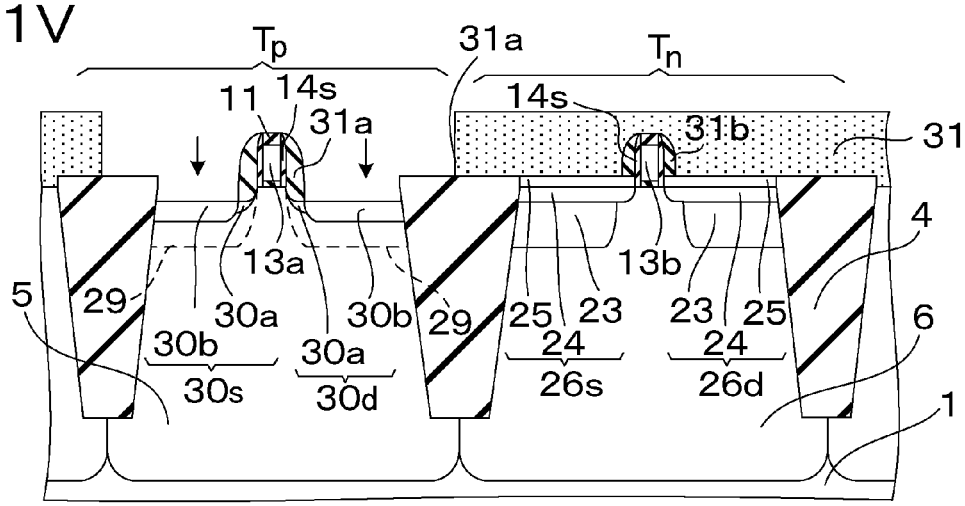
Figure 1W:
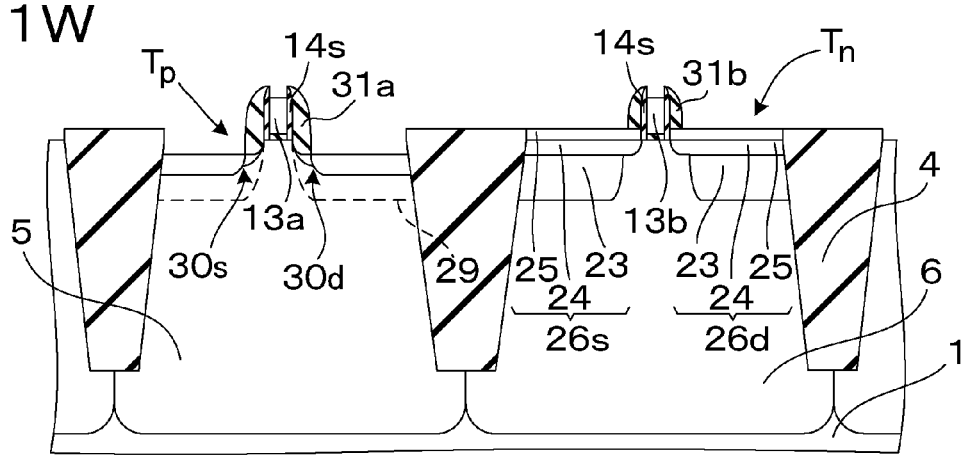
Figure 1X:
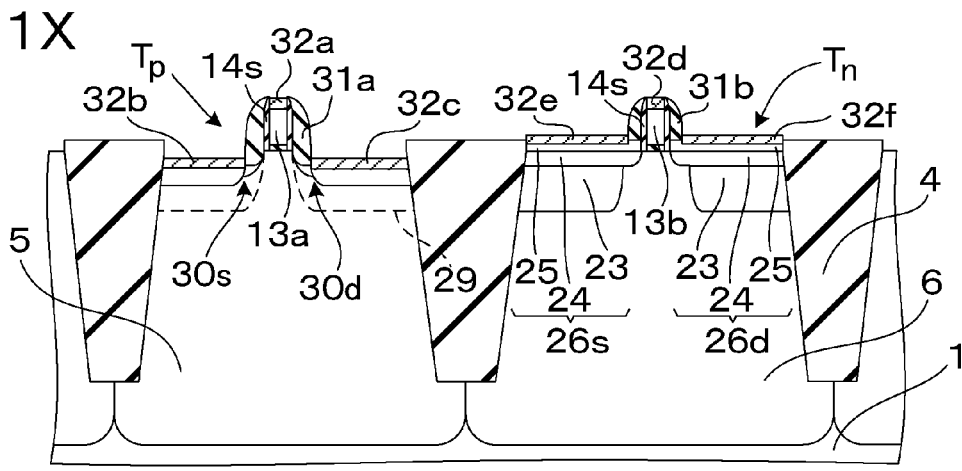

FIGS. 1A to 1x are sectional views illustrating a method for manufacturing a semiconductor device according to a first embodiment.

Initially, steps to form a structure illustrated in FIG. 1A will be described.

A silicon oxide film 2 having a thickness of about 10 nm is formed on a semiconductor substrate, for example, on an upper surface of n-type or p-type silicon substrate 1, by a dry thermal oxidation method. In oxidation, the temperature of an oxygen-containing atmosphere may be set at, for example, about 900° C. In this regard, the semiconductor substrate may be an SOI substrate.

Thereafter, a silicon nitride film 3 having a thickness of about 112 nm is formed on the silicon oxide film 2 by a CVD method. The silicon nitride film 3 is formed by using a gas containing, for example, dichlorosilane ($SiH_2Cl_2$) and ammonia ($NH_3$) and setting the substrate temperature at about 750° C.

Subsequently, a resist pattern (not illustrated in the drawing) having opening portions in element isolation regions A is formed on the silicon nitride film 3, and the silicon nitride film 3 and the silicon oxide film 2 are etched through the use of the resist pattern as a mask. In this manner, opening portions 3a are formed in the silicon nitride film 3 and the silicon oxide film 2 in the isolation regions A. The isolation regions A are regions making off active regions B.

After the resist pattern is removed, as illustrated in FIG. 1B, the silicon substrate 1 is dry-etched through the opening portions 3a by using the silicon nitride film 3 as a mask. In this manner, element isolation grooves is are formed in the silicon substrate 1. As for an etching gas, for example, a chlorine based gas is used.

Steps to form a structure illustrated in FIG. 1C will be described.

Initially, a silicon oxide film is formed in the element isolation grooves 1a and on the silicon nitride film 3 by a plasma CVD method. The silicon oxide film is formed having a thickness to completely fill the insides of the element isolation grooves 1a. Furthermore, the silicon nitride film 3 is used as a polishing stopper, and the silicon oxide film is polished by a chemical mechanical polishing (CMP) method so as to be removed from the upper surface of the silicon nitride film 3. In this manner, the element isolation groove 1a and the silicon oxide film filled therein serve as a shallow trench isolation (STI) 4.

In this regard, a silicon oxide film instead of the STI 4 may be formed as an element isolation structure on the surface of the silicon substrate 1 by a LOCOS method.

Steps to form a structure illustrated in FIG. 1D will be described.

The silicon nitride film 3 is removed with, for example, hot phosphoric acid at about 150° C. and, subsequently, the silicon oxide film 2 under the silicon nitride film 3 is removed with hydrofluoric acid (HF). The STI 4 becomes thin by being etched with hydrofluoric acid.

Furthermore, an n-type impurity, for example, phosphorus or arsenic, is ion-implanted into a PMOS-forming region marked off by the STIs 4, so as to form an n-well 5. Moreover, a p-type impurity, for example, boron, is ion-implanted into an NMOS-forming region marked off by the STIs 4, so as to form a p-well 6. In the implantation of impurity ions, regions not implanted with the ion is covered with a resist pattern. In this regard, the ion-implanted impurity is activated through annealing.

As illustrated in FIG. 1E, a silicon oxide film having a thickness of about 1.5 nm serving as a gate insulating film 7 is formed on the surface of the silicon substrate 1 by a dry thermal oxidation method. Thereafter, a polysilicon film 8 having a thickness of about 100 nm is formed on the gate insulating film 7 and the STIs 4 by the CVD method.

As illustrated in FIG. 1F, a photoresist is applied to the polysilicon film 8, and this is exposed and developed, so as to form a resist pattern 9 having an opening portion 9a above the p-well 6. Phosphorus serving as an n-type impurity is ion-implanted into the polysilicon film 8 through the use of the resist pattern 9 as a mask. The dosage of phosphorus is specified to be, for example, $8 \times 10^{15}$ $cm^{-2}$. The resist pattern 9 is removed.

As illustrated in FIG. 1G, a resist pattern 10 having an opening portion 10a above the n-well 5 is formed on the polysilicon film 8. Boron serving as a p-type impurity is ion-implanted into the polysilicon film 8 through the use of the resist pattern 10 as a mask. The dosage of boron is specified to be, for example, $6 \times 10^{15}$ $cm^{-2}$. The resist pattern 10 is removed.

The n-type and the p-type impurities implanted into the polysilicon film 8 are activated through a heat treatment, for example, rapid thermal anneal (RTA).

Steps to form a structure illustrated in FIG. 1H will be described.

A silicon nitride film serving as an insulating film 11 having a thickness of about 30 nm is formed on the polysilicon film 8 by the CVD method.

A photoresist is applied to the insulating film 11 and, thereafter, the photoresist is subjected to exposure, development, and the like, so as to form a resist pattern 12 in the shape of a gate electrode and the shape of a wiring.

The insulating film 11 and the polysilicon film 8 exposed at the resist pattern 12 are etched, and the resist pattern 12 is removed. In this manner, as illustrated in FIG. 1I, the polysilicon film 8 left above the n-well 5 and the p-well 6 are assumed to be first and second gate electrodes 13a and 13b, respectively.

As illustrated in FIG. 1J, the silicon nitride film 14 having a thickness of about 10 nm is formed on the silicon substrate 1, the first gate electrode 13a, the second gate electrode 13b, and the insulating film 11 by the CVD method. In this case, in order to prevent diffusion of impurities in the gate electrodes 13a and 13b, the temperature of formation of the silicon nitride film 14 is set within the range of, for example, 500° C. or higher, and lower than 600° C.

As illustrated in FIG. 1K, the silicon nitride film 14 is etched back. In this manner, the upper surface of the silicon substrate 1 is exposed and, in addition, the silicon nitride film 14 is left on the side surfaces of the first and the second gate electrodes 13a and 13b, so as to serve as insulating side wall spacers 14s.

As illustrated in FIG. 1L, the side wall spacers 14s, the silicon nitride film 11, and the STIs 4 are used as masks, the surfaces of the n-well 5 and the p-well 6 are etched by, for example, a plasma etching method. In this manner, first and second recesses (concave portions) 15 and 16 having a depth of about 10 nm are formed in both side regions of each of the first and the second gate electrodes 13a and 13b in the n-well 5 and the p-well 6. A gas containing chlorine and a dilution gas is used as an etching gas.

Active regions not provided with the first and the second recesses 15 and 16 are covered with a resist pattern 17.

After the photoresist 17 is removed, as illustrated in FIG. 1M, a silicon oxide film 18 having a thickness of about 5 nm is formed on the first and the second gate electrodes 13a and 13b, the insulating film 11, the side wall spacers 14s, the STIs 4, and the silicon substrate 1 by the CVD method. A gas containing, for example, silane and oxygen is used as a growth gas in this case.

A silicon nitride film 19 having a thickness of about 20 nm is formed on the silicon oxide film 18 by the plasma CVD method. A gas containing silane and ammonia is used as a growth gas in this case.

A photoresist is applied to the silicon nitride film 19, and a resist pattern 20 having an opening portion 20a above the p-well 6 is formed by subjecting the photoresist to exposure, development, and the like.

As illustrated in FIG. 1N, the silicon nitride film 19 and the silicon oxide film 18 are etched through the opening portion 20a by, for example, an RIE method and, thereby, the second recesses 16 of the p-well 6 are exposed. The silicon oxide film 18 and the silicon nitride film 19 are left as an insulating side wall spacers 21 on the side surfaces of the second gate electrode 13b.

A gas containing, for example, a fluorine based gas is used as an etching gas in this case.

The silicon nitride film 19 above the n-well 5 and the silicon oxide film 18 are covered with the resist pattern 20 and, therefore, are not etched. Then, the resist pattern 20 is removed.

As illustrated in FIG. 1O, the silicon nitride film 19, the gate electrodes 13a and 13b, the STIs 4, and the side wall spacers 21 are used as masks, and the p-well 6 is dry-etched. In this manner, third recesses 22 are formed under regions, which are apart from the second gate electrode 13b and which are a part of the second recesses 16. The third recess 22 is formed at a depth of, for example, about 40 nm from the surface of the silicon substrate 1.

The third recess 22 and the second recess 16 constitute the shape of a step in the region in the vicinity of the second gate electrode 13b.

In this regard, a gas containing, for example, chlorine is used as an etching gas to form the third recesses 22.

Regarding the surface of the third recesses 22, the p-well 6 may be etched with organic alkali acid, for example, tetramethylammonium hydroxide (TMAH). The depth of the second recesses 16 may be further increased by about 10 nm.

As illustrated in FIG. 1P, first phosphorus-doped $Si_{1-y}C_y$ layers 23 are selectively epitaxially grown on the p-well 6 exposed at the third recesses 22. The first phosphorus-doped $Si_{1-y}C_y$ layers 23 are formed having a thickness to fill the third recesses 22, that is, a thickness of, for example, about 30 nm. As for reaction gases to form the phosphorus-doped $Si_{1-y}C_y$ layers, $SiH_4$, $P_2H_6$, $SiC_3H_8$, and $H_2$ may be used.

Phosphorus-doped $Si_{1-y}C_y$ is represented by a composition of $Si_{1-y-z}C_yP_z$. In the composition formula, y and z represent independently a ratio of the number of atoms and the total of y and z is smaller than 1.

The first phosphorus-doped $Si_{1-y}C_y$ layer 23 contains carbon at a ratio of the number of atoms, that is, a concentration, of 2.0 atomic percent or more, and 2.5 atomic percent or less and further contains phosphorus at a ratio of the number of atoms of 0 atomic percent or more, and 1.0 atomic percent or less. For example, y is specified to be 0.02 and z is specified to be 0.005, that is, carbon is specified to be 2.0 atomic percent and phosphorus is specified to be 0.5 atomic percent. The phosphorus concentration of 2.0 atomic percent corresponds to $1 \times 10^{21}$ atoms/cm$^3$ on a unit volume basis, and the concentration is adjusted by controlling the flow rate of $P_2H_6$.

In formation of the first phosphorus-doped $Si_{1-y}C_y$ layer 23, the substrate temperature is specified to be lower than 600° C. Since the growth rate of $Si_{1-y-z}C_yP_z$ is low under the above-described temperature condition, it is difficult to selectively grow the first $Si_{1-y-z}C_yP_z$ by adding HCl serving as an etching gas. In this regard, the etching gas is added for the purpose of selectively removing amorphous $Si_{1-y-z}C_yP_z$ grown on the silicon nitride film 19.

For example, in the case where the third recess 22 having a depth of 30 nm is filled with $Si_{1-y-z}C_yP_z$ having a thickness of about 30 nm, growth is conducted in a plurality of batches, for example, in three batches. After growth in each batch, the gas introduced into a reaction chamber may be switched from a raw material gas to a chlorine based gas, for example, a HCl gas.

The chlorine based gas is introduced and, thereby, a polycrystalline or amorphous-like phosphorus-doped carbon contained silicon layer formed on the silicon nitride film 19, the STIs 4, and the side wall spacers 21 is etched through reaction with the introduced gas. The etching selectivity ratio of the single crystal first phosphorus-doped $Si_{1-y}C_y$ layer 23 in the third recess 22 to the polycrystalline or amorphous-like phosphorus-doped carbon contained silicon layer on the silicon nitride film 19 is about 1/20.

After the polycrystalline phosphorus-doped carbon contained silicon layer having a thickness of 10 nm on the silicon nitride film 19 is etched, the single crystal first phosphorus-doped $Si_{1-y}C_y$ layer 23 having a thickness of about 9.5 nm is left in the third recess 22. After three batches of film formation and three batches of etching, the phosphorus-doped $Si_{1-y}C_y$ layer 23 in the third recess 22 has a thickness of about 28.5 nm.

In the case where the polycrystalline phosphorus-doped and carbon contained silicon layer having a thickness of about 10.5 nm is formed, the third recess 22 is filled with the first phosphorus-doped $Si_{1-y}C_y$ layer 23 having a thickness of about 10 nm after the third etching of the phosphorus-doped $Si_{1-y}C_y$ layer.

After a resist pattern (not illustrated in the drawing) having an opening portion above the p-well 6 is formed, the side wall spacers 21 on the side surfaces of the second gate electrode 13b are removed with phosphoric acid. After the resist pattern is removed, the silicon oxide film 18 on the side surfaces of the second gate electrode 13b are removed with hydrofluoric acid, so that the second recesses 16 of the p-well 6 are exposed, as illustrated in FIG. 1Q.

Steps to form a structure illustrated in FIG. 1R will be described.

Second phosphorus-doped $Si_{1-y}C_y$ layers 24 are formed on the p-well 6 exposed at the second recesses 16 and the first phosphorus-doped silicon carbide layers 23. The second phosphorus-doped $Si_{1-y}C_y$ layer 24 has a large amount of phosphorus content and a small amount of carbon content as compared with those of the first phosphorus-doped $Si_{1-y}C_y$ layer 23.

The material for the second phosphorus-doped $Si_{1-y}C_y$ layer 24 is represented by a composition formula of $Si_{1-y-z}C_yP_z$. The ratio of the number of C atoms is 0 atomic percent or more, and 1.5 atomic percent or less and the ratio of the number of P atoms is 0 atomic percent or more, and 2.0 atomic percent or less. For example, the ratio y of the number of atoms is specified to be 0.015 and the ratio z of the number of atoms is specified to be 0.015, that is, the carbon concentration is specified to be 1.5 atomic percent and the phosphorus concentration is specified to be 1.5 atomic percent.

The polycrystalline second phosphorus-doped carbon contained silicon layer 24 formed on the silicon nitride film 19, the side wall spacers 21, and the second gate electrode 13b is removed through dry etching by using a chlorine based gas, for example, HCl.

The etching rate of the single crystal phosphorus-doped $Si_{1-y}C_y$ layer is about one-twentieth of the etching rate of the polycrystalline phosphorus-doped and carbon contained silicon layer. Therefore, the thickness of the second phosphorus-doped $Si_{1-y}C_y$ layer 24 selectively grown on the first phosphorus-doped $Si_{1-y}C_y$ layer 23 is reduced by about 5% because of etching after growth, so that the second phosphorus-doped $Si_{1-y}C_y$ layer 24 is formed in consideration of a reduction in thickness.

The second phosphorus-doped $Si_{1-y}C_y$ layer 24 to fill the second recess 16 is formed having a thickness that makes the height of the upper surface substantially equal to the height of the upper surface of the silicon substrate 1, for example, a thickness of about 10 nm.

Third phosphorus-doped $Si_{1-y}C_y$ layers 25 having a thickness of about 5 nm are formed on the second phosphorus-doped $Si_{1-y}C_y$ layers 24. The third phosphorus-doped $Si_{1-y}C_y$ layer 25 has the same composition as, for example, that of the second phosphorus-doped $Si_{1-y}C_y$ layer 24.

A polycrystalline phosphorus-doped and carbon contained silicon layer on the silicon nitride film 19 is removed through dry etching by using a chlorine based gas.

The second and the third phosphorus-doped $Si_{1-y}C_y$ layers 24 and 25 are isolated from the second gate electrode 13b by the side wall spacers 14s.

Figure 2:
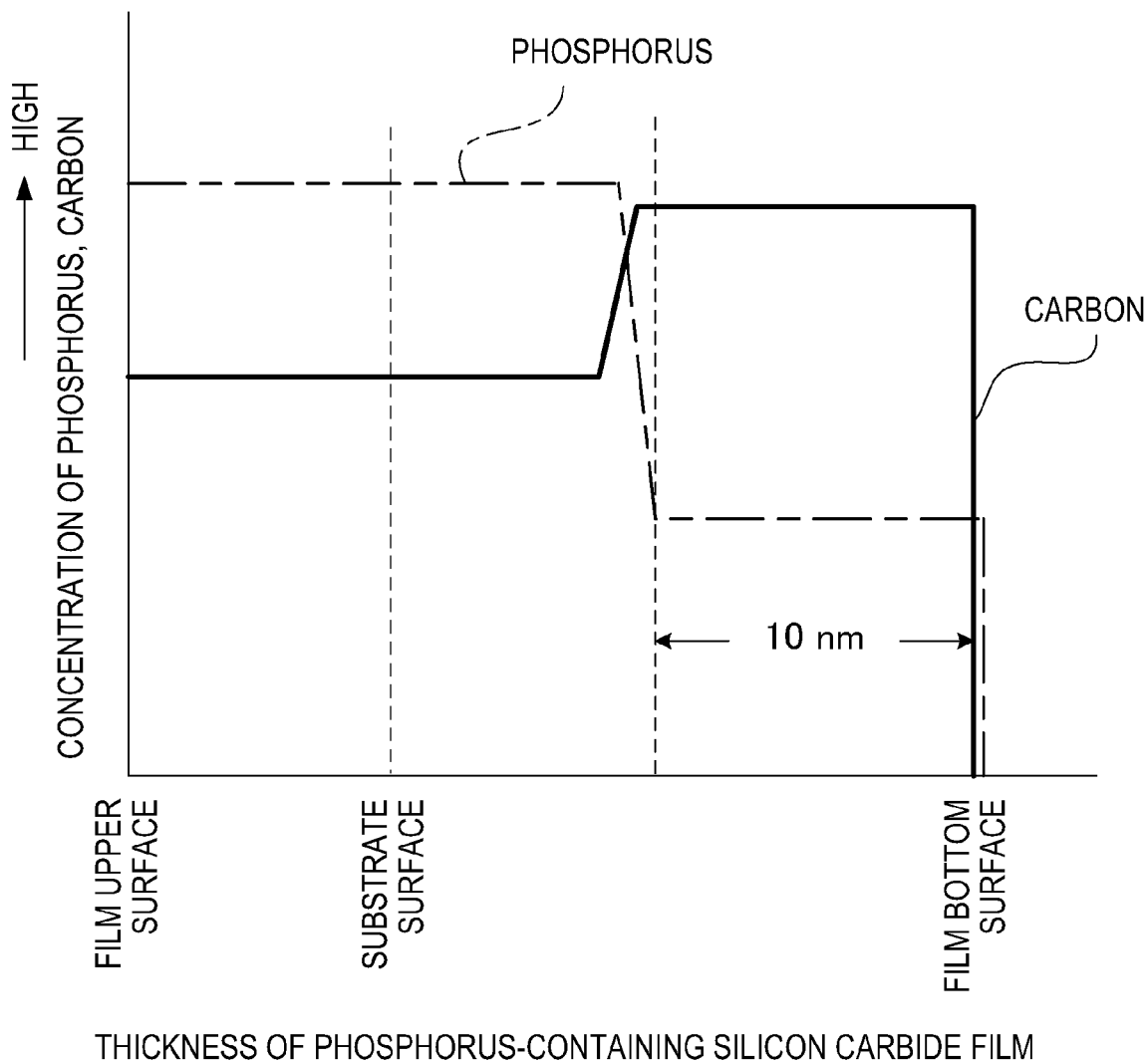
FIG. 2 is a concentration distribution diagram of carbon and phosphorus in the film thickness direction in a source region and a drain region of an NMOS transistor of the semiconductor device according to the first embodiment.

The carbon concentrations and the phosphorus concentrations in the film thickness direction of the first to the third phosphorus-doped $Si_{1-y}C_y$ layers 23, 24, and 25 exhibit distributions illustrated in, for example, FIG. 2. The laminated first to third phosphorus-doped $Si_{1-y}C_y$ layers 23, 24, and 25 serve as a source region 26s and a drain region 26d on two sides of the second gate electrode 13b.

In this manner, an NMOS transistor $T_n$ including the source region 26s, the drain region 26d, the gate insulating film 7, the second gate electrode 13b, and the p-well 6 is formed.

As illustrated in FIG. 1S, a photoresist is applied to the silicon substrate 1, and a resist pattern 27 is formed by subjecting this to exposure and development. The resist pattern 27 has a shape covering the second gate electrode 13b, the third phosphorus-doped silicon carbide layers 25, and the like above the p-well 6 and, in addition, exposing the silicon nitride film 19.

The silicon nitride film 19 and the silicon oxide film 18 in the region exposed at the resist pattern 27 are removed. The silicon nitride film 19 is removed by, for example, the plasma etching method through the use of a fluorine based gas, and the silicon oxide film 18 is removed with, for example, hydrofluoric acid. The resist pattern 27 is removed.

As illustrated in FIG. 1T, a fresh photoresist is applied to the silicon substrate 1, and a resist pattern 28 is formed by subjecting this to exposure and development. The resist pattern 28 has an opening portion 28a above the n-well 5 and, in addition, has a shape covering the p-well 6.

Germanium silicon regions 30 are formed on both sides of and below the first gate electrode 13a by implanting germanium ions ($Ge^+$) into the n-well 5 through the opening portion 28a of the resist pattern 28. As for the ion implantation condition of Ge, the acceleration energy is set at 20 keV, and the dosage is set at $5 \times 10^{14}$ $cm^{-2}$.

Fluorinated boron ions ($BF_2^+$) are implanted into the n-well 5 through the opening portions 28a and, thereby, p-type extension regions 30a are formed on both sides of and below the first gate electrode 13a. Thereafter, the resist pattern 28 is removed.

The p-type extension regions 30a are activated through rapid thermal processing, e.g., spike anneal or millisecond anneal.

A silicon oxide film covering the first and the second gate electrodes 13a and 13b and having a thickness of 20 nm is formed on the silicon substrate 1 by the CVD method at low temperatures, for example, 500° C. or lower.

The silicon oxide film is etched back by an RIE method through the use of a fluorine based gas. As illustrated in FIG. 1U, the n-well 5 and source/drain regions 26s and 26d are exposed and, in addition, the silicon oxide film serving as insulating side wall spacers 31a and 31b is left on the side surfaces of the first and the second gate electrodes 13a and 13b.

As illustrated in FIG. 1V, a resist pattern 31 is formed on the silicon substrate 1. The resist pattern 31 covers the p-well 6 and, in addition, has an opening portion exposing the first gate electrode 13a and the p-type extension regions 30a above the n-well 5.

The first gate electrode 13a and the resist pattern 31 are used as masks, and p-type impurity ions, for example, boron ions ($B^+$) are implanted into the n-well 5. In the n-well 5, high-concentration p-type impurity regions 30b are formed on both sides of the first gate electrode 13a. As for the ion implantation condition, for example, the acceleration energy is specified to be 3.0 keV, and the dosage is specified to be $8 \times 10^{15}$ $cm^{-2}$.

Subsequently, the high-concentration p-type impurity regions 30b are activated by conducting very short time annealing, for example, spike annealing, at a temperature of 950° C. or lower. The high-concentration p-type impurity regions 30b constitute a source region 30s and a drain region 30d together with the p-type extension regions 30a on two sides of the first gate electrode 13a. The resist pattern 31 is removed.

In this manner, a PMOS transistor $T_p$ including the source region 30s, the drain region 30d, the gate insulating film 7, the first gate electrode 13a, and the n-well 5 is formed.

As illustrated in FIG. 1W, hot phosphoric acid is used, and the silicon nitride films 11, which are the insulating films 11 on the first and the second gate electrodes 13a and 13b, are removed. The upper surfaces of the polysilicon films 8 serving as the first and the second gate electrodes 13a and 13b are exposed.

Steps to form a structure illustrated in FIG. 1X will be described.

A metal film, for example, a nickel alloy film, having a thickness of about 10 nm is formed on the gate electrodes 13a and 13b, the silicon substrate 1, and the like by a sputtering method. Silicide layers 32a to 32f are formed by reacting silicon of each of the third phosphorus-doped silicon carbide layers 25, the source/drain regions 30s and 30d, the gate electrodes 13a and 13b with the nickel alloy film through, for example, rapid thermal processing (RTP) at about 300° C.

The un-reacted nickel alloy film is removed by using persulfuric acid or the like. The resistance reduction of the silicide layers 32a to 32f is conducted through additional thermal processing at 400° C. to 500° C.

Figure 1Y:
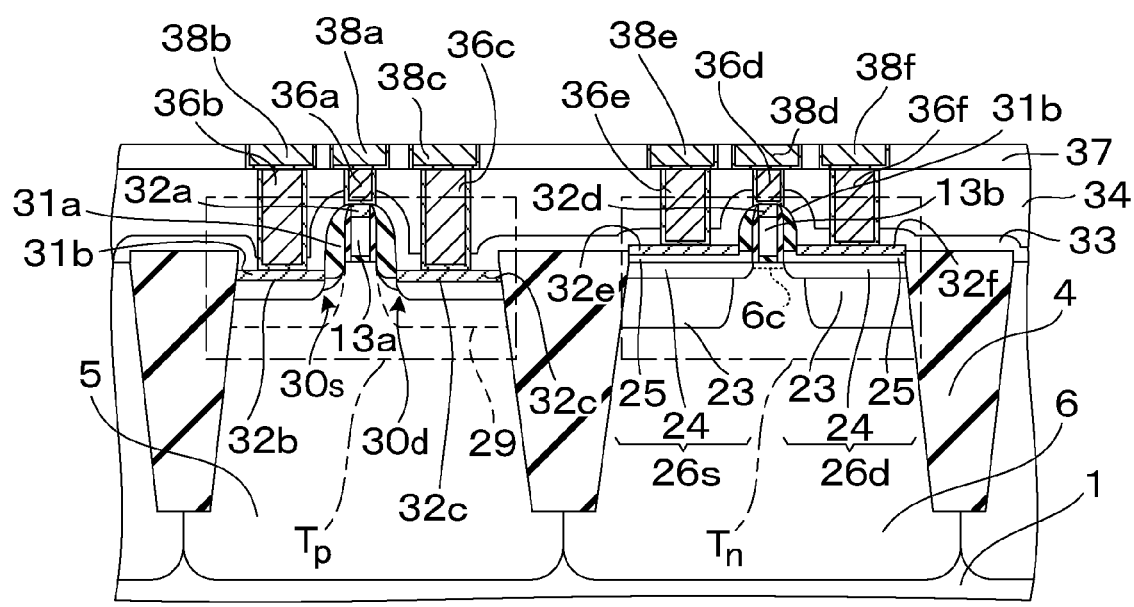

Steps to form a structure illustrated in FIG. 1Y will be described.

A silicon nitride film serving as an etching stop film 33 is formed on the PMOS transistor $T_p$, the NMOS transistor $T_n$, and the silicon substrate 1. A silicon oxide film serving as a first interlayer insulating film 34 is formed on the etching stop film 33 by the CVD method.

A resist pattern (not illustrated in the drawing) is formed on the first interlayer insulating film 34. The resist pattern has an opening portion above each of the first and the second gate electrodes 13a and 13b, the source/drain regions 30, and the third phosphorus-doped silicon carbide layers 25.

Contact holes reaching the etching stop film 33 are formed by etching the first interlayer insulating film 34 through the opening portions in the resist pattern. The etching stop film 33 is etched through the contact holes and, thereby, the contact holes are deepened, so as to expose the silicide layers 32a to 32f on each of the first and the second gate electrodes 13a and 13b, the source/drain regions 30, and the third phosphorus-doped $Si_{1-y}C_y$ layers 25.

A Ti film having a thickness of 2 nm to 8 nm is formed in each contact hole by the plasma CVD method. A gas containing titanium tetrachloride or titanium tetrabromide is used as a film forming gas.

A TiN film having a thickness of 1 nm to 20 nm is formed on the Ti film by a sputtering method. A tungsten (W) film is formed on the TiN film by a plating method. The W film is formed having a thickness to completely fill the contact hole.

The W film, the TiN film, and the Ti film on the first interlayer insulating film 34 are removed through CMP. The W film, the TiN film, and the Ti film left in the contact holes constitute electrically conductive plugs 36a to 36f.

A silicon oxide film serving as a second interlayer insulating film 37 is formed on the first interlayer insulating film 34, and wiring grooves are formed in the second interlayer insulating film 37. A part of the wiring grooves expose the electrically conductive plugs 36a to 36f.

After a Ta barrier metal film and a Cu film are filled into each wiring groove sequentially, the Ta barrier metal film and the Cu film on the upper surface of the second interlayer insulating film 37 are removed through CMP. The Ta barrier metal film and the Cu film left in the wiring grooves constitute wirings 38a to 38f. As for the wirings 38a to 38f, a laminated structure including an aluminum film or an aluminum alloy film may be patterned through photolithography.

Vias, insulating films, wirings, and the like are formed on the second interlayer insulating film 37.

In the above-described embodiment, regarding the NMOS transistor $T_n$, each of the source region 26s and the drain region 26d sandwiching the channel region 6c include the first, the second, and the third phosphorus-doped $Si_{1-y}C_y$ layers 23, 24, and 25.

Since a tensile stress is applied to the channel region 6c in a lateral direction, the mobility of an electron moving in the channel region 6c increases.

The concentration distributions of phosphorus and carbon in the first, the second, and the third phosphorus-doped $Si_{1-y}C_y$ layers 23, 24, and 25 have profiles illustrated in FIG. 2 in the thickness direction. In this regard, the thickness direction of the film is also the direction of the depth of the second and the third recesses 16 and 22.

In FIG. 2, the carbon concentration in the first phosphorus-doped $Si_{1-y}C_y$ layer 23 is higher than the carbon concentration in the second phosphorus-doped $Si_{1-y}C_y$ layer 24. On the other hand, the phosphorus concentration of the second phosphorus-doped $Si_{1-y}C_y$ layer 24 is higher than the phosphorus concentration of the first phosphorus-doped $Si_{1-y}C_y$ layer 23.

Resulting from a difference in carbon concentration, the energy band gap of the second phosphorus-doped $Si_{1-y}C_y$ layer 24 becomes smaller than the energy band gap of the first phosphorus-doped $Si_{1-y}C_y$ layer 23.

Figure 3:
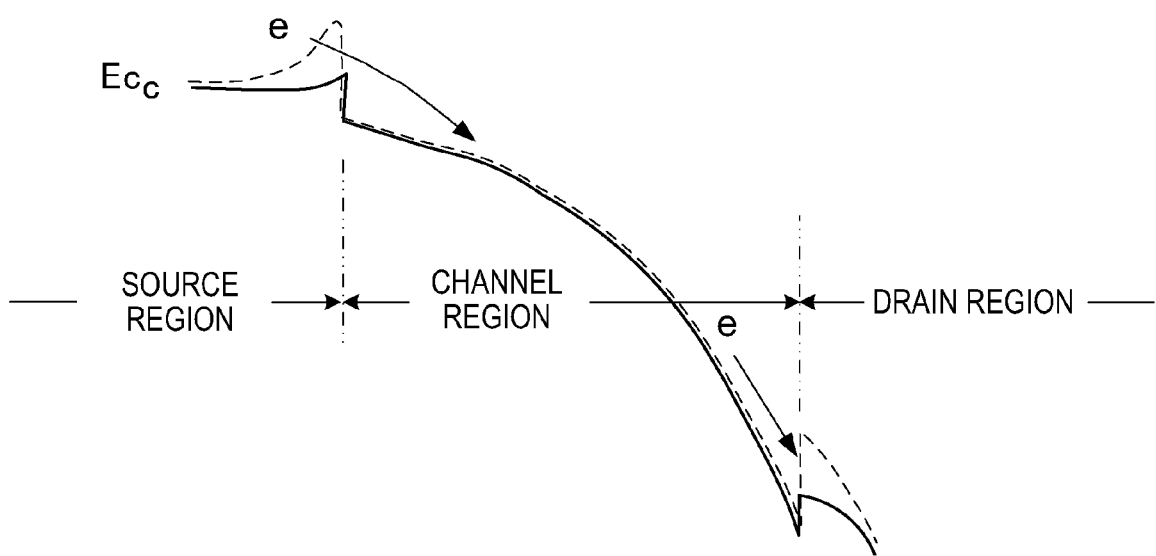
FIG. 3 is a diagram illustrating conduction bands in energy bands of the source region, a channel region, and the drain region of the NMOS transistor of the semiconductor device according to the first embodiment.

The profile of the conduction band edge $E_c$ in the energy band of the second phosphorus-doped $Si_{1-y}C_y$ layer 24 bonded to the channel region 6c in the lateral direction is indicated by a solid line in FIG. 3, and band offsets occur at the boundaries between the channel region 6c and the source/drain regions 26s and 26d. In this case, the energy barrier generated at the boundary between the second phosphorus-doped $Si_{1-y}C_y$ layer 24 in the drain region 26d and the channel region 6c because of the band offset is low due to band gap narrowing effect by large amount of phosphorus, and a reduction in the amount of electrons injected from the channel region 6c into the drain region 26d is suppressed.

On the other hand, in the case where the carbon concentration in the second phosphorus-doped $Si_{1-y}C_y$ layer 24 is made equal to the carbon concentration of the first phosphorus-doped silicon carbide layer 23, the profile of the conduction band edge $E_c$ becomes as indicated by a broken line in FIG. 3. The energy barrier at the boundary between the second phosphorus-doped $Si_{1-y}C_y$ layer 24 and the channel region 6c becomes high, and an electron e becomes difficult to inject into the drain region 26d.

In the present embodiment, the phosphorus concentration in the second phosphorus-doped $Si_{1-y}C_y$ layer 24 is specified to be high and, therefore, the electrical conductivity increases in a region adjacent to the channel region 6c in the source region 26s and the drain region 26d. On the other hand, the phosphorus concentration in the first phosphorus-doped $Si_{1-y}C_y$ layer 23 is lower than that in the second phosphorus-doped $Si_{1-y}C_y$ layer 24. Therefore, the electrical conductivities of the lower portions of the source region 26s and the drain region 26d do not become high. However, the first phosphorus-doped $Si_{1-y}C_y$ layer 23 is apart from the channel region 6c, in which the electron e moves, so that the movement of electron is not adversely affected.

Phosphorus has an effect of serving as a complement to carbon with respect to strain applied to the channel region 6c. Consequently, even a $Si_{1-y}C_y$ layer having a low carbon concentration may apply strain more than or equal to the strain resulting from the carbon concentration to the channel region 6c by being doped with phosphorus. The detail thereof will be described later.

The first phosphorus-doped $Si_{1-y}C_y$ layer 23 below the channel region 6c has a high carbon concentration and, therefore, it is possible to increase the moving speed of electron by applying a tensile stress to the channel region 6c under the second gate electrode 13b.

As described above, it is possible to increase the amount of strain of the channel region 6c, and at the same time, suppress an increase in resistance value in the region, in which electrons move, and reduce the height of the energy barrier.

The carbon concentration on a ratio of the number of atoms basis in the first phosphorus-doped $Si_{1-y}C_y$ layer 23 is set at 2 atomic percent for the following reasons.

In the case where silicon germanium (SiGe) films are epitaxially grown on both sides of the channel region for the purpose of increasing the mobility of holes in the channel region in the n-well 5, it is preferable that 18% or more on a ratio of the number of atoms basis of Ge is contained in the SiGe film.

In the case where the ratio of the number of Ge atoms in a SiGe crystal is 18%, the compressive strain is about 2%. Both the in-plane strain and the out-of-plane strain are ratios of a difference between the lattice constant of SiGe and the lattice constant of Si to the lattice constant of Si. In this regard, the in-plane strain $\epsilon_{para}$ is a strain in a direction parallel to a lower surface, and the out-of-plane strain $\epsilon_{ver}$ is a strain of a plane in a direction of growth of a film. The $\epsilon_{para}$ and the $\epsilon_{ver}$ are represented by Formulae (1) and (2).

In this connection, in Formulae (1) and (2), $a_{SiGe}$ represents an in-plane lattice constant of SiGe, $a_{SiGe\perp}$ represents a lattice constant in a thickness direction of SiGe, and $a_{Si}$ represents a lattice constant of Si.

$$\epsilon_{para}=(a_{SiGe}-a_{Si})/a_{Si} \quad (1)$$

$$\epsilon_{ver}=(a_{SiGe\perp}-a_{Si})/a_{Si} \quad (2)$$

Figure 4:
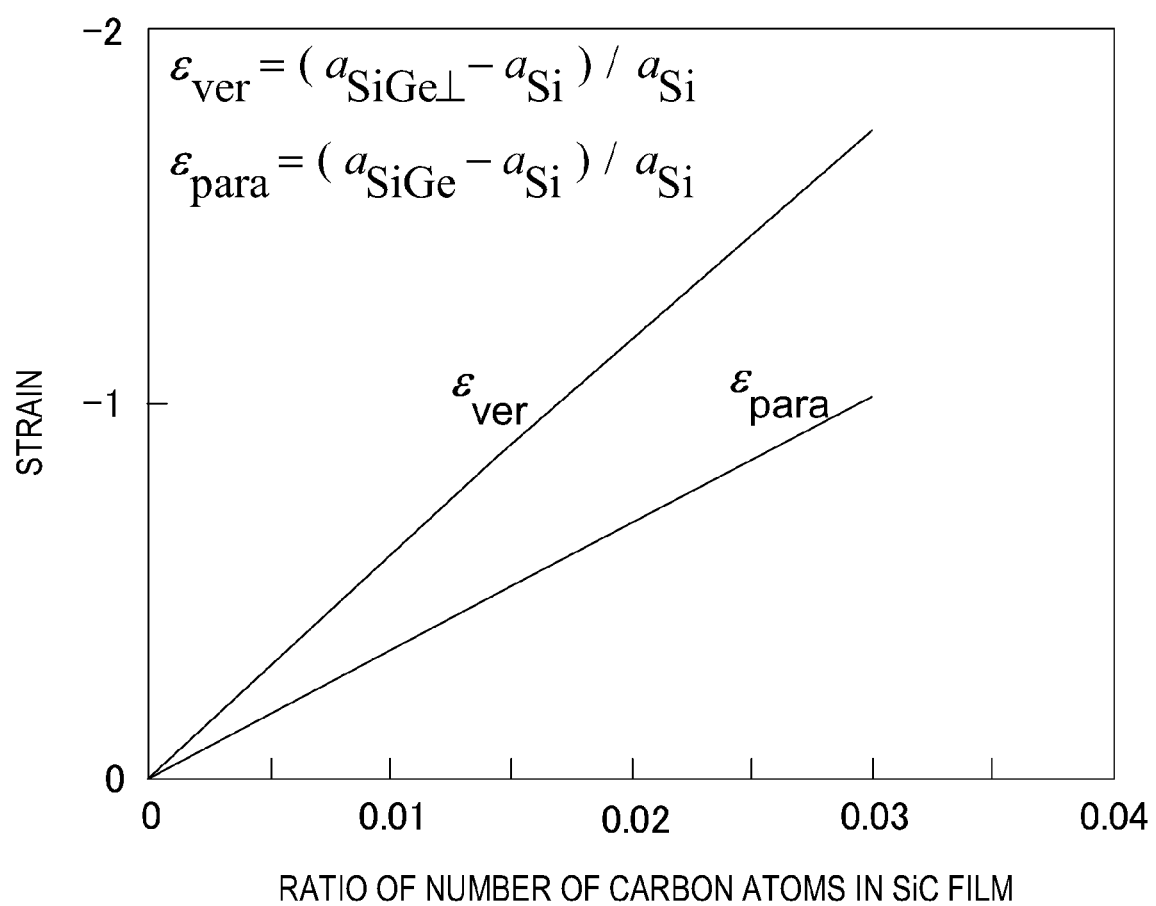
FIG. 4 is a diagram illustrating the relationship between the value of strain parameter of silicon germanium and the ratio of the number of carbon atoms in carbon doped silicon.

In order to specify the absolute value of the strain rate of $Si_{1-y}C_y$ to be about 2% as with SiGe, the ratio of the number of C atoms in a single crystal $Si_{1-y}C_y$ film is set at 0.02, that is, the concentration is set at 2 atomic percent, based on the relationship illustrated in FIG. 4.

On the one hand, in the case where Si layers on both sides of the channel region 6c in the p-well 6 is not doped with C, the resistance between the source region and the drain region sandwiching the channel region 6c becomes about 80 Ω/sq. On the other hand, in the case where SiC layers containing C at a concentration of 1.5 atomic percent are formed on both sides of the channel region 6c, the resistance between the source region and the drain region becomes about 120 Ω/sq to 160 Ω/sq.

Alternatively, in the case where $Si_{1-y}C_y$ having a C concentration of 2 atomic percent is epitaxially grown in the source/drain regions, the energy band gap of the source/drain regions become about 110 meV larger than that of the silicon channel region. Consequently, as indicated by the broken line illustrated in FIG. 3, an energy barrier is generated at an end of the drain region because of a band offset.

Here, the in-plane strain $\epsilon_{para}$ and the strain $\epsilon_{ver}$ in the growth direction of the $Si_{1-y}C_y$=film with respect to the Si film are represented by Formulae (3) and (4), respectively. In Formulae (3) and (4), $a_{SiC}$ represents an in-plane lattice constant of $Si_{1-y}C_y$, $a_{SiC\perp}$ represents a lattice constant in a film formation direction of $Si_{1-y}C_y$=, and $a_{Si}$ represents a lattice constant of silicon.

$$\epsilon_{para}=(a_{SiC}-a_{Si})/a_{Si} \quad (3)$$

$$\epsilon_{ver}=(a_{SiC\perp}-a_{Si})/a_{Si} \quad (4)$$

In order to reduce the energy barrier at the end of the drain region, it is preferable that the C concentration of the $Si_{1-y}C_y$ film is reduced to 1.5 atomic percent or less and it is preferable to increase the strain in that state and increase the electrical conductivity at the same time. In order to achieve the object, there is a method for further reducing the $a_{SiC}$ and the $a_{SiC\perp}$ in Formulae (3) and (4).

For example, a method, in which an element having a lattice constant smaller than that of Si in a Si mother crystal and serving as a donor is added to a $Si_{1-y}C_y$ crystal, is adopted.

Figure 5:
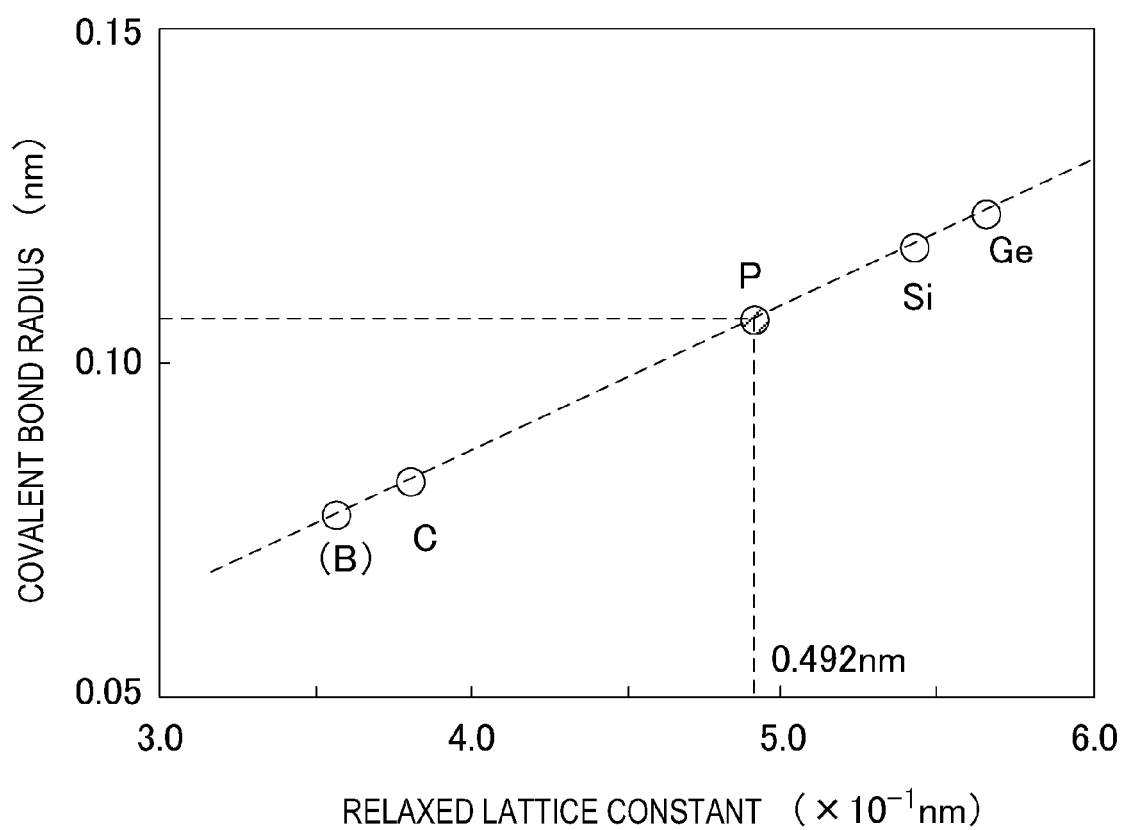
FIG. 5 is a diagram illustrating the relationship between the relaxed lattice constant and the covalent bond radius with respect to each element of boron, carbon, phosphorus, silicon, and germanium used in production of the semiconductor device according to the first embodiment.

Regarding Si, Ge, C, B (boron), and P (phosphorus), the relationship between the covalent bond radius and the pseudo-diamond lattice constant are as illustrated in FIG. 5. In this regard, in FIG. 5, calculation is conducted on the assumption that B and P are present in place in the diamond lattice in the Si film.

Among those elements, the covalent bond radius of P serving as a donor is smaller than the covalent bond radius of Si. In the case where the lattice constant of the pseudo-diamond lattice is calculated through conversion from the covalent bond radius of P, the lattice constant of P results in 0.493 nm and is smaller than 0.543 nm of Si. Therefore, P may assist the strain effect of C having a small lattice constant.

Figure 6:
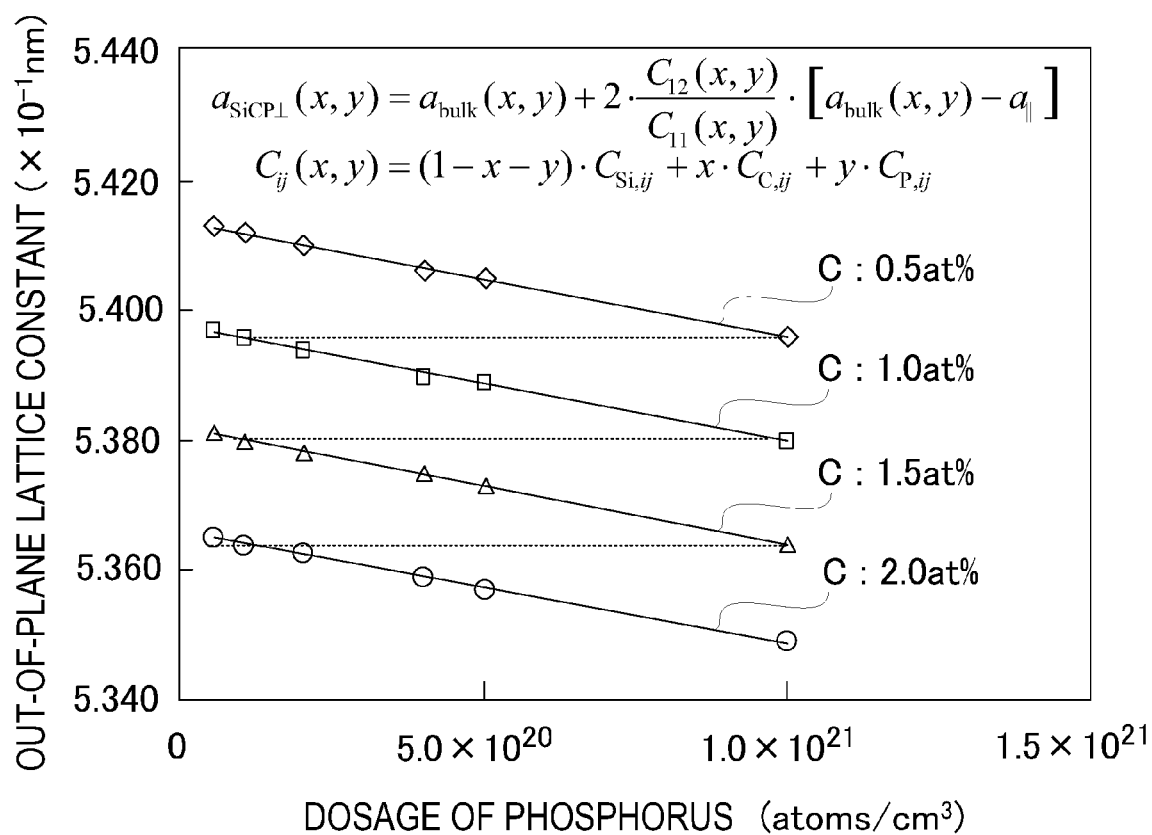
FIG. 6 is a diagram illustrating the relationship between the carbon concentration added to a silicon film in the source/drain regions of the semiconductor device according to the first embodiment, the dosage of phosphorus, and the out-of-plane lattice constant.

Then, the lattice constant of phosphorus-doped $Si_{1-y}C_y$ is estimated based on the lattice constant illustrated in FIG. 5 and is indicated by solid lines illustrated in FIG. 6. In this regard, in FIG. 6, the out-of-plane lattice constant $a_{SiCP\perp}$ represents a lattice constant in a film thickness direction.

According to FIG. 6, for example, the $a_{SiCP\perp}$ under the condition of C concentration=0.5 atomic percent and P concentration=$1\times10^{21}$ atoms/cm$^3$ is nearly equal to the $a_{SiCP\perp}$ under the condition of C concentration=1.0 atomic percent and P concentration=0 atoms/cm$^3$. Furthermore, the $a_{SiCP\perp}$ under the condition of C concentration=1.0 atomic percent and P concentration=$1\times10^{21}$ atoms/cm$^3$ is nearly equal to the $a_{SiCP\perp}$ under the condition of C concentration=1.5 atomic percent and P concentration=0 atoms/cm$^3$. Moreover, the $a_{SiCP\perp}$ under the condition of C concentration=1.5 atomic percent and P concentration=$1\times10^{21}$ atoms/cm$^3$ is nearly equal to the $a_{SiCP\perp}$ under the condition of C concentration=2.0 atomic percent and P concentration=0 atoms/cm$^3$.

Incidentally, the lattice parameters of phosphorus-doped $Si_{1-y}C_y$ grown on the (001) face of a silicon substrate and in the state of strained tetragon have the relationship represented by Formulae (5) and (6).

In Formulae (5) and (6), $a_\parallel$ represents an in-plane lattice constant, $a_{SiCP\perp}$ represents a lattice constant in a film growth direction, $a_{bulk}(x,y)$ represents an alloy bulk lattice parameter indicated by x and y, which are ratios of the number of atoms of P and C, and $C_{ij}(x,y)$ represents an elastic constant of the alloy. The elastic constants of Si, C, and P are represented by $C_{Siij}$, $C_{Cij}$, and $C_{Pij}$, respectively.

$$a_{SiCP\perp}(x, y) = a_{bulk}(x, y) + 2 \cdot \frac{C_{12}(x, y)}{C_{11}(x, y)} \cdot [a_{bulk}(x, y) - a_\parallel] \quad (5)$$

$$C_{ij}(x,y)=(1-x-y)\cdot C_{Si,ij}+x\cdot C_{Cij}+y\cdot C_{P,ij} \quad (6)$$

Therefore, the value of mixed crystal lattice constant of phosphorus-doped $Si_{1-y}C_y$ in a relaxed state becomes smaller than the crystal lattice constant of a $Si_{1-y}C_y$=crystal having the same carbon concentration based on the Vegard's law.

Regarding the energy band structure of a bonding portion between the $Si_{1-y}C_y$ crystal and the silicon crystal, in the same manner as illustrated in FIG. 3, a band offset occurs at the interface between $Si_{1-y}C_y$ and silicon, and the band offset becomes large as the carbon concentration increases.

A large band offset serves as an energy barrier to electrons moving from the channel region to the end of the drain region. In the case where the C concentration of the silicon carbide layer is specified to be 2 atomic percent, the band offset becomes about 100 meV.

On the other hand, if the concentration of p-type or n-type dopant contained in a silicon crystal becomes high, an effect of reducing the band gap resulting from degeneracy of the conductive band, that is, a so-called band gap narrowing effect, occurs.

Figure 7:
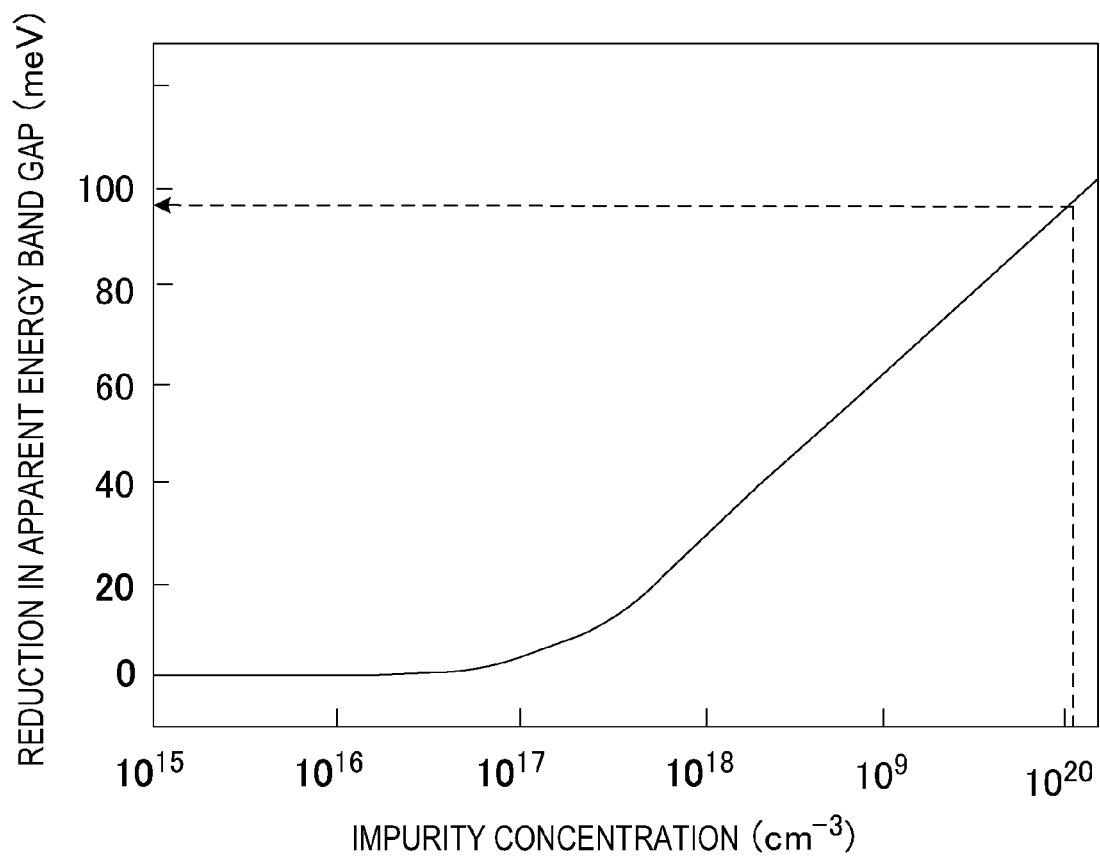
FIG. 7 is a diagram illustrating the relationship between the impurity concentration and the apparent energy band gap.

FIG. 7 illustrates an example of band gap narrowing. When the phosphorus concentration exceeds about $1 \times 10^{19}$ atoms/$cm^3$, band gap narrowing appears remarkably, and when the phosphorus concentration is $1 \times 10^{20}$ atoms/$cm^3$, the value of band gap narrowing reaches 100 meV.

In this regard, the energy band gap may be changed depending on the Phosphorus concentration of the Source-Drain region. Therefore, in order to reduce the energy barrier resulting from the band offset, the phosphorus concentrations of the source/drain regions are determined.

Therefore, the amount of dopant mixed into the $Si_{1-y}C_y$ layer is adjusted and, thereby, the amount of band offset is reduced, the amount of energy barrier is reduced, and the resistance of the source/drain regions is reduced.

Regarding the source region 26s and the drain region 26d of the NMOS transistor $T_n$ according to the present embodiment, for example, the carbon concentration in the second phosphorus-doped $Si_{1-y}C_y$ layer 24 is specified to be 1.5 atomic percent or less and the phosphorus concentration is specified to be 1.5 atomic percent. Further, the carbon concentration in the first phosphorus-doped $Si_{1-y}C_y$ layer 23 is specified to be 2.0 atomic percent and the phosphorus concentration is specified to be 0.5 atomic percent.

Figure 8:
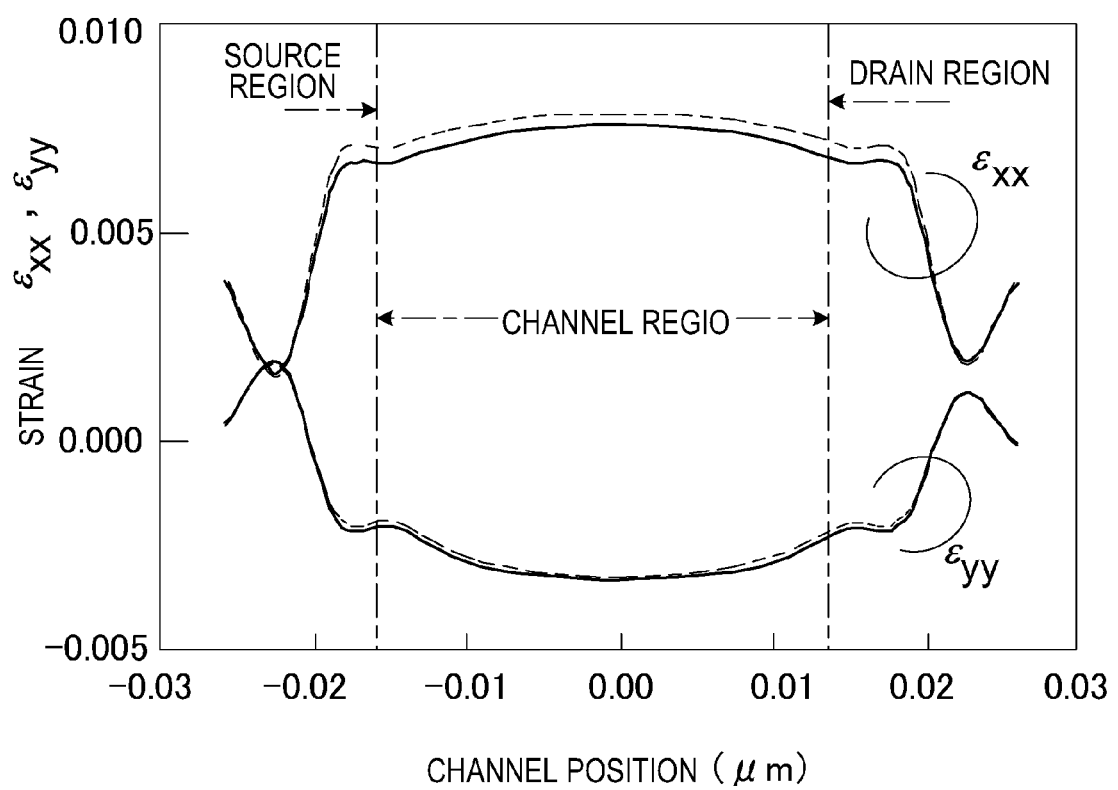
FIG. 8 is a diagram illustrating the relationship between the strain of the channel region of the semiconductor device according to the first embodiment and the strain of the channel region according to a comparative embodiment.

Under that condition, regarding the p-well 6 between the source region 26s and the drain region 26d, the amount of strain due to the tensile strength applied to the channel region 6c from the surface to the depth of 5 nm was estimated by a finite element method (FEM), and the results indicated by the solid line illustrated in FIG. 8 were obtained. In the finite element method, the elastic constant converted from a change in lattice constant was employed as basic data.

Furthermore, an NMOS transistor, in which the same phosphorus-doped $Si_{1-y}C_y$ layer as the first phosphorus-doped $Si_{1-y}C_y$ layer 23 was formed instead of the second phosphorus-doped $Si_{1-y}C_y$ layer 24 in the first recess 16, was employed as a comparative embodiment.

Regarding the comparative embodiment as well, the amount of strain of the channel region due to the tensile strength was estimated by a finite element method, and the results indicated by a wavy line illustrated in FIG. 8 were obtained.

According to FIG. 8, almost no difference is observed in the amount of strain of the channel region between the present embodiment and the comparative embodiment. It is clear that in the phosphorus-doped $Si_{1-y}C_y$ layer, an increase in phosphorus concentration through a reduction in carbon concentration in the silicon crystal is sufficient for generating a strain in the channel region. Regarding each of an reduction in resistance value between the source region 26s and the drain region 26d and a reduction in band offset, according to FIG. 3 and FIG. 7, the present embodiment is superior to the comparative embodiment.

In this regard, in FIG. 8, $\epsilon_{xx}$ represents an in-plane strain and $\epsilon_{yy}$ represents a strain in a film thickness direction.

Figure 9:
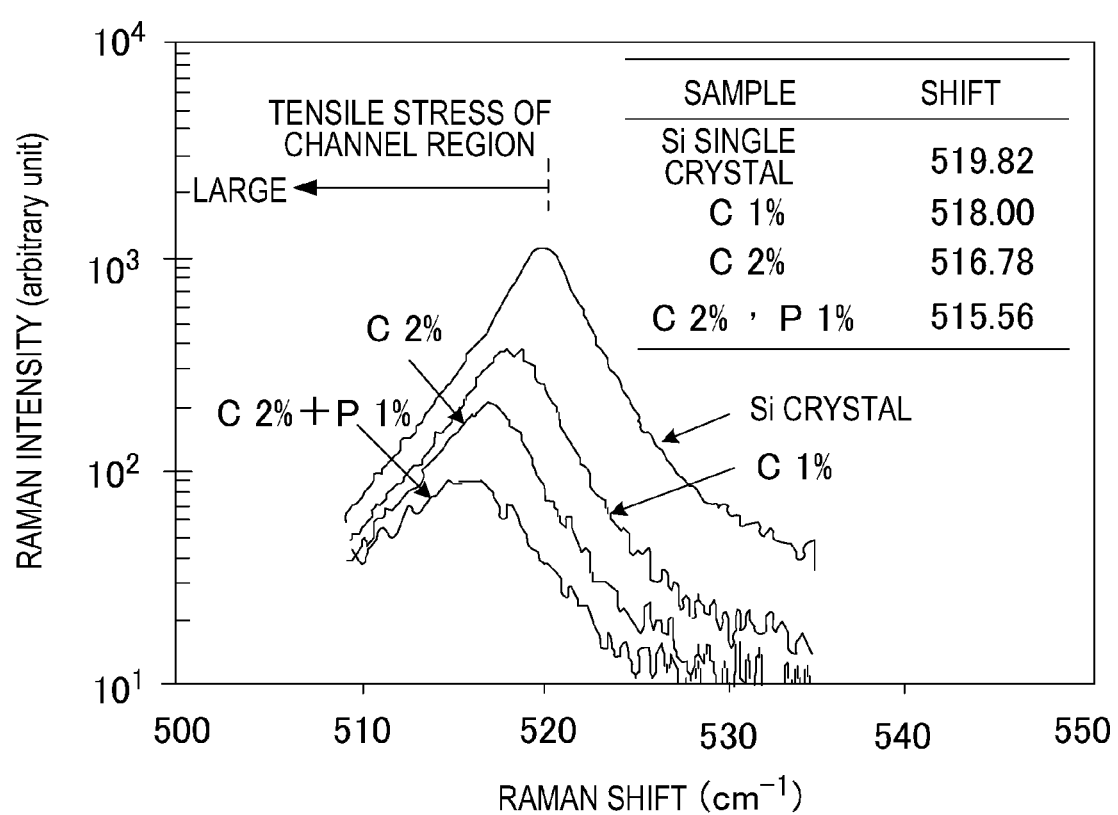
FIG. 9 is a diagram illustrating the relationship between the Raman shift and the Raman intensity of a phosphorus-and carbon doped silicon layer disposed in the source/drain regions of the semiconductor device according to the first embodiment and the relationship between the Raman shift and the Raman intensity in the comparative embodiment.

FIG. 9 illustrates the results of measurement through UV Raman spectroscopy with respect to the silicon layer, the $Si_{1-y}C_y$ layer, and the phosphorus-doped $Si_{1-y}C_y$ layer. The silicon layer is a single crystal and is indicated by Si in FIG. 9. Furthermore, in FIG. 9, C 1% and C 2% indicate two silicon carbide layers containing 1 atomic percent and 2 atomic percent, respectively, of C. Moreover, in FIG. 9, C 2%+P 1% indicates the phosphorus-doped $Si_{1-y}C_y$ layer containing 1 atomic percent of P and 2 atomic percent of C.

According to FIG. 9, a peak of Raman shift of the silicon layer is present at 520 $cm^{-1}$ without applied strain. Furthermore, the $Si_{1-y}C_y$ layer and the phosphorus-doped $Si_{1-y}C_y$ layer have the Raman shift values smaller than that of the silicon layer and cause a tensile strain in the channel region 6c. In addition, as the carbon concentration becomes higher, the Raman shift values become small and the tensile strain becomes large. Moreover, even when the carbon concentration is the same, addition of phosphorus causes a further reduction in Raman shift and an increase in the amount of tensile strain.

As described above, in FIG. 1Y, in the case where the carbon concentration is reduced and the phosphorus concentration is increased at the end portions close to the channel region 6c of the surface of the silicon substrate 1 among the source region 26s and the drain region 26d, the amount of band offset may be reduced and, in addition, the resistance between the source region 26s and the drain region 26d may be reduced. Consequently, the electron mobility in the channel region 6c between the source region 26s and the drain region 26d may increase.

In order to increase the tensile strain of the channel region 6c, it is preferable that the carbon concentration of the first phosphorus-doped $Si_{1-y}C_y$ layers 23, which are formed on both sides of the channel region 6c and which are below the channel region 6c, is specified to be 2% or more.

Figure 10A:
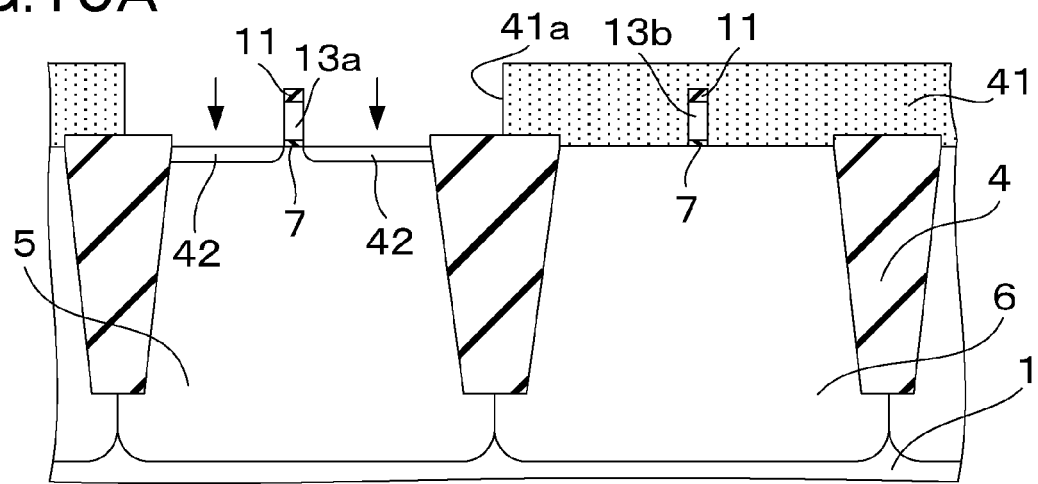
FIGS. 10A to 10R are sectional views illustrating steps of forming a semiconductor device according to a second embodiment.
Figure 10B:
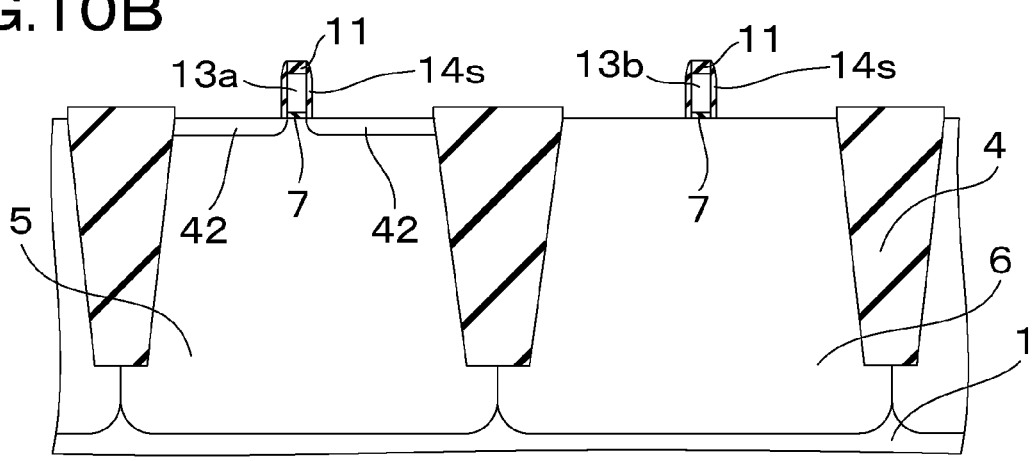
Figure 10C:
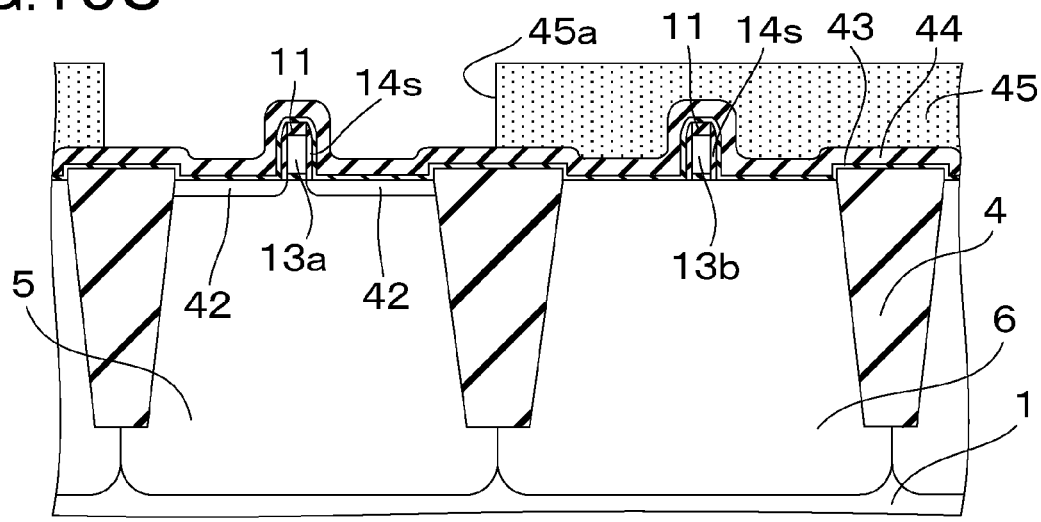
Figure 10D:
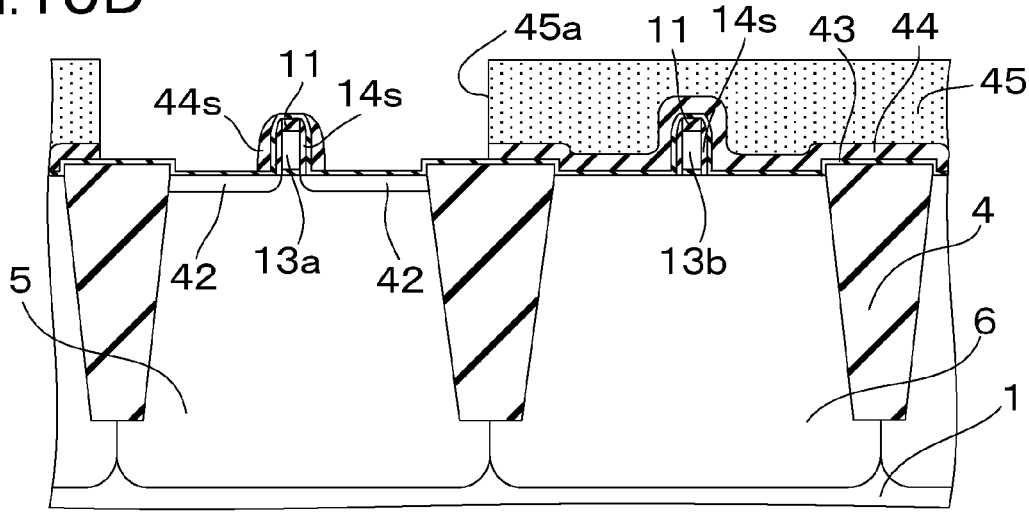
Figure 10E:
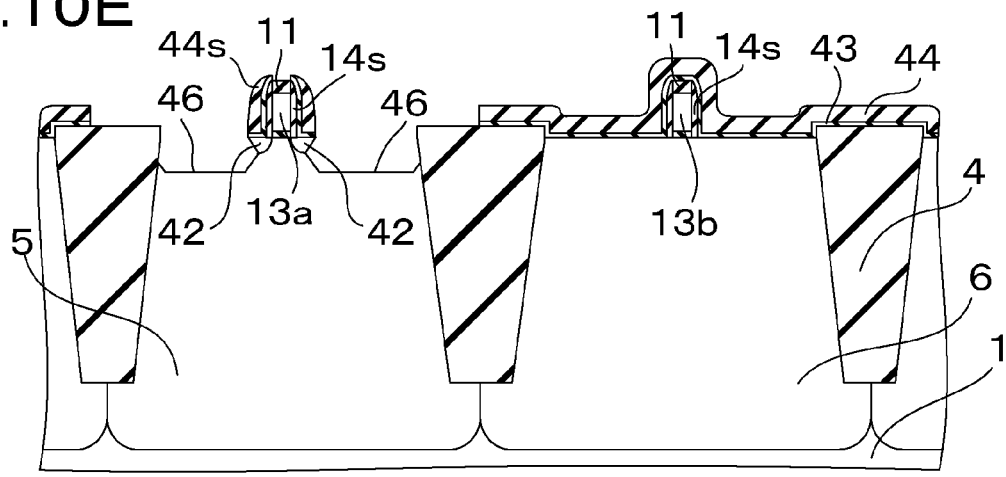
Figure 10F:
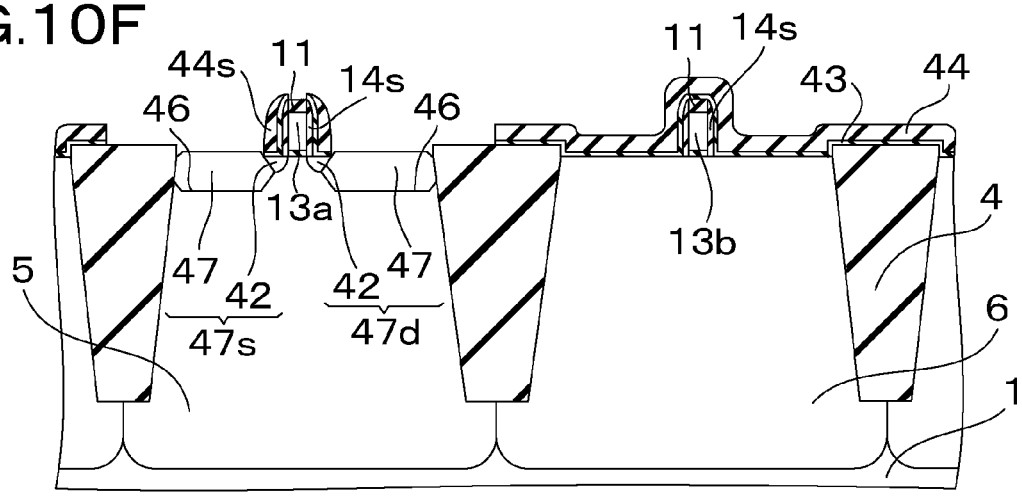
Figure 10G:
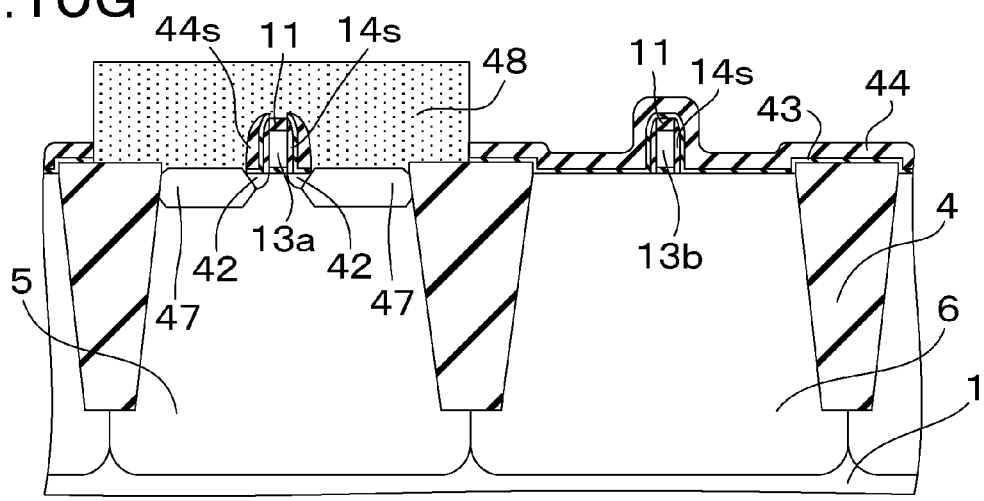
Figure 10H:
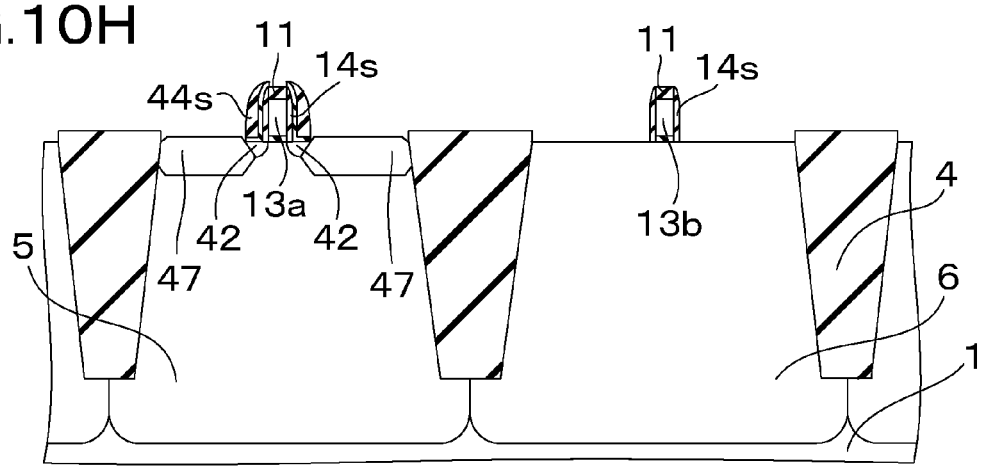
Figure 10I:
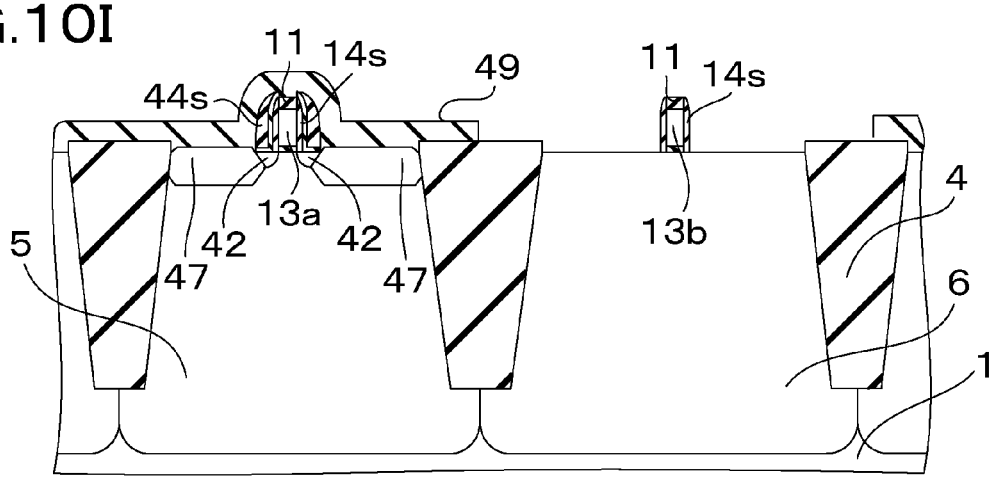
Figure 10J:
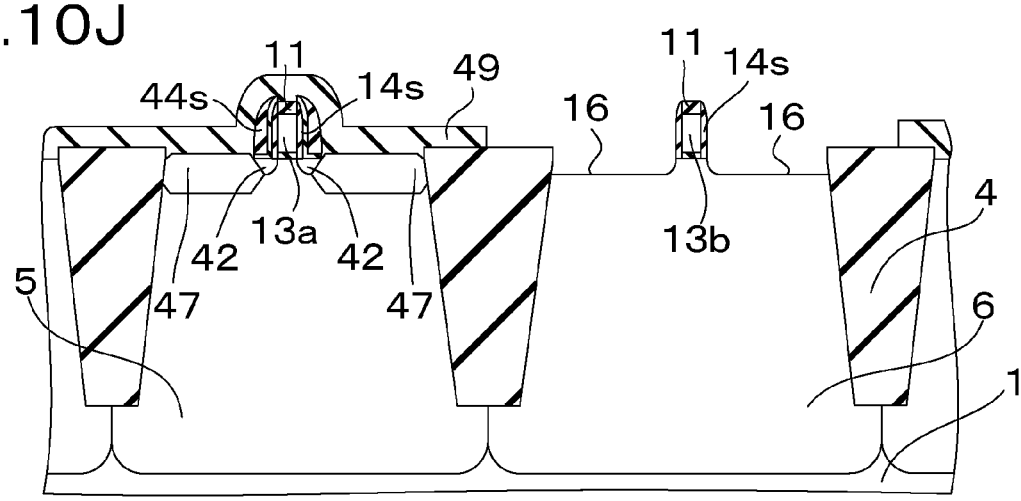
Figure 10K:
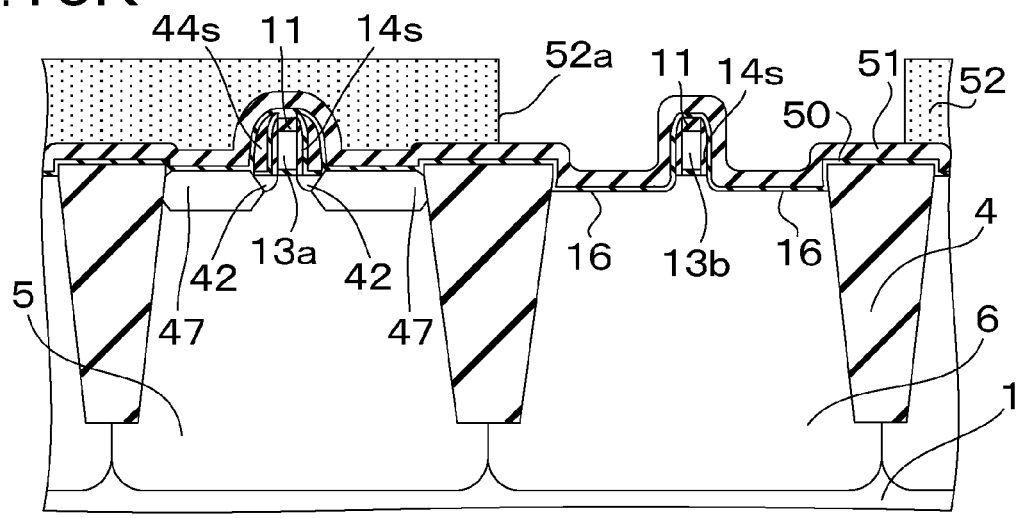
Figure 10L:
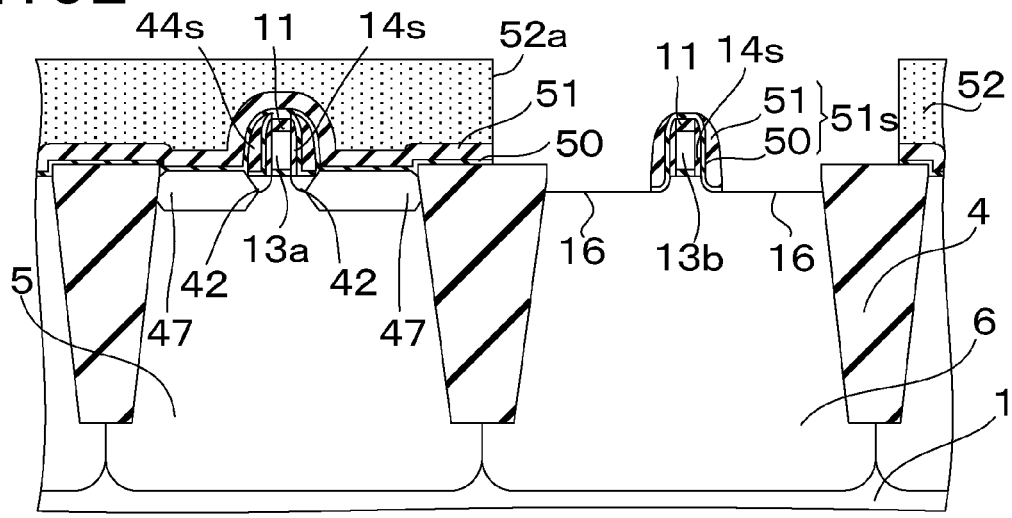
Figure 10M:
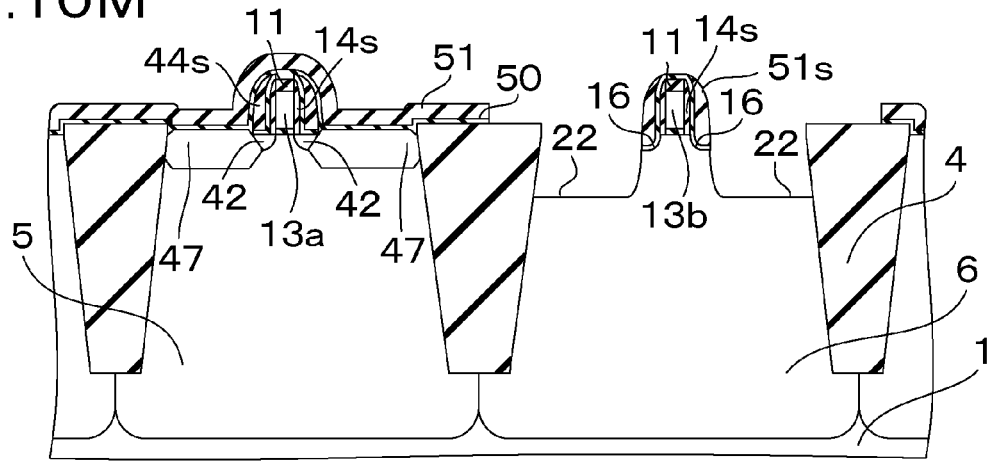
Figure 10N:
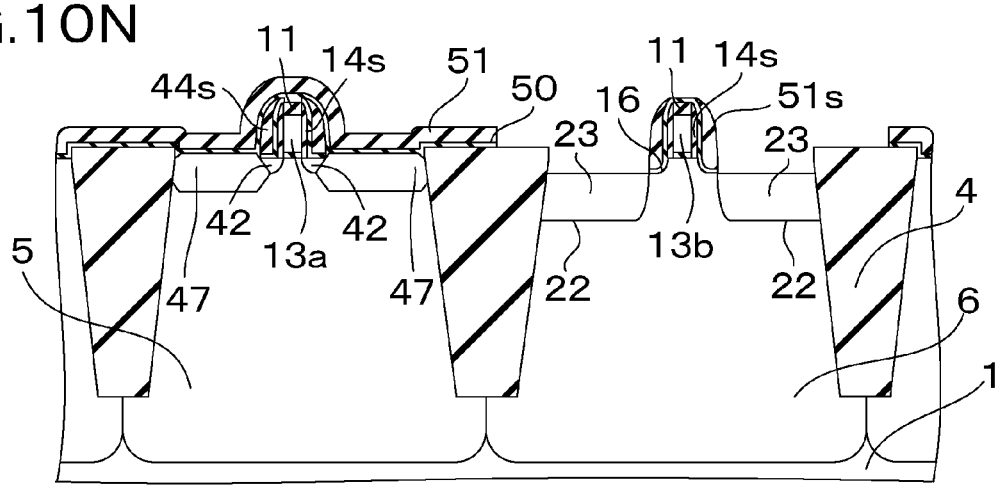
Figure 10O:
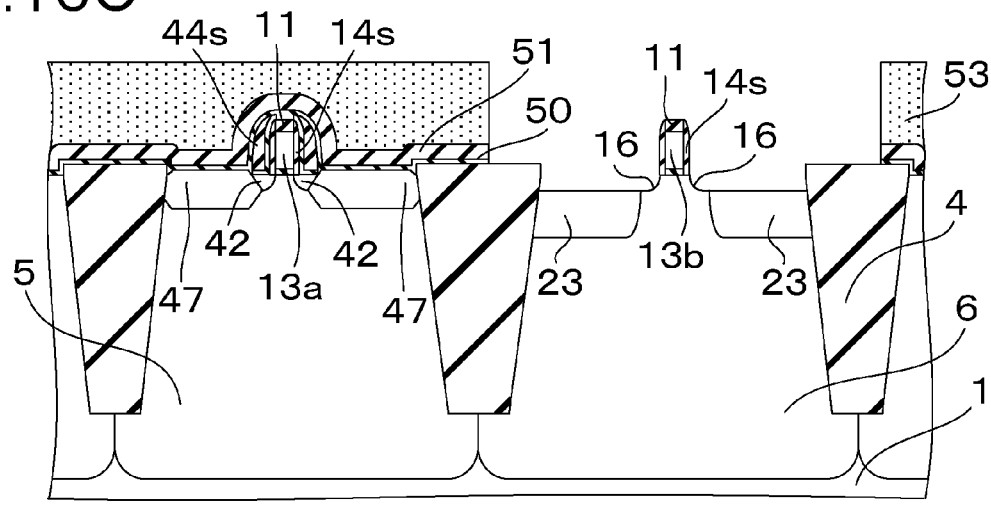
Figure 10P:
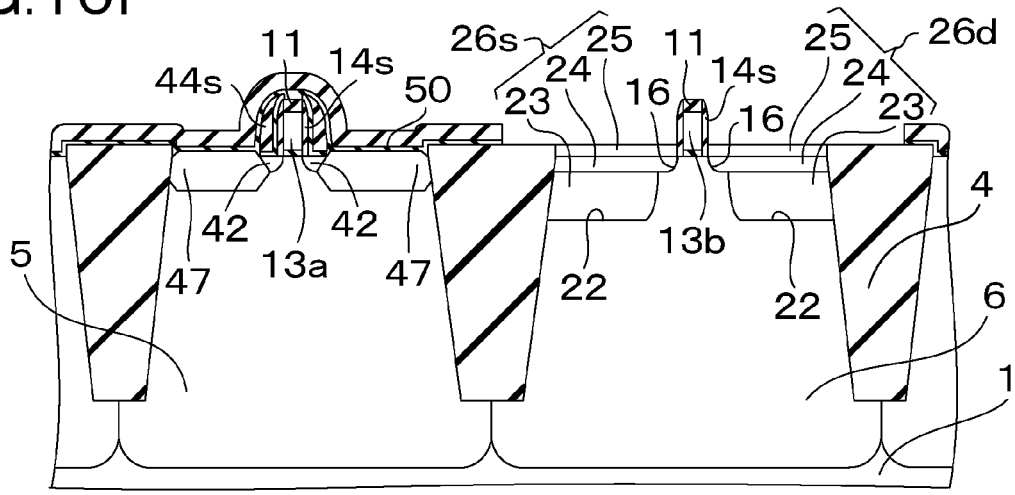
Figure 10Q:
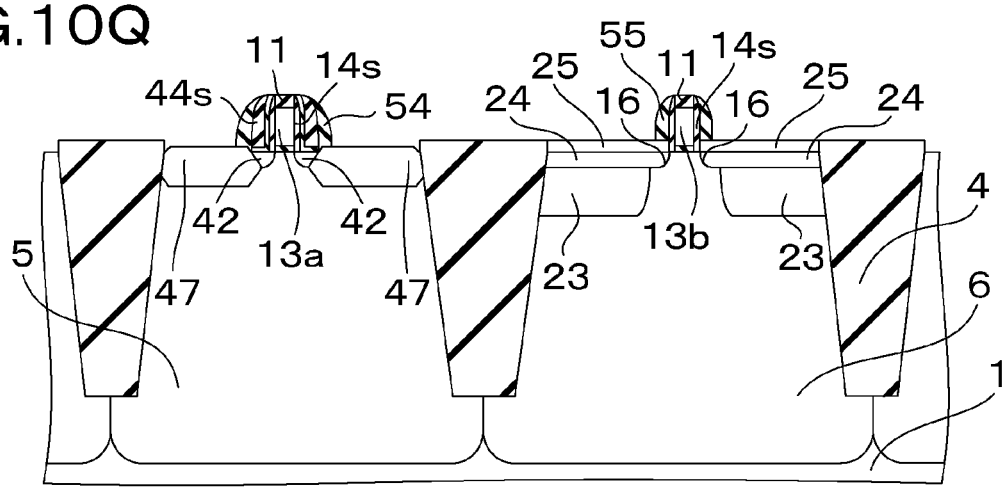
Figure 10R:
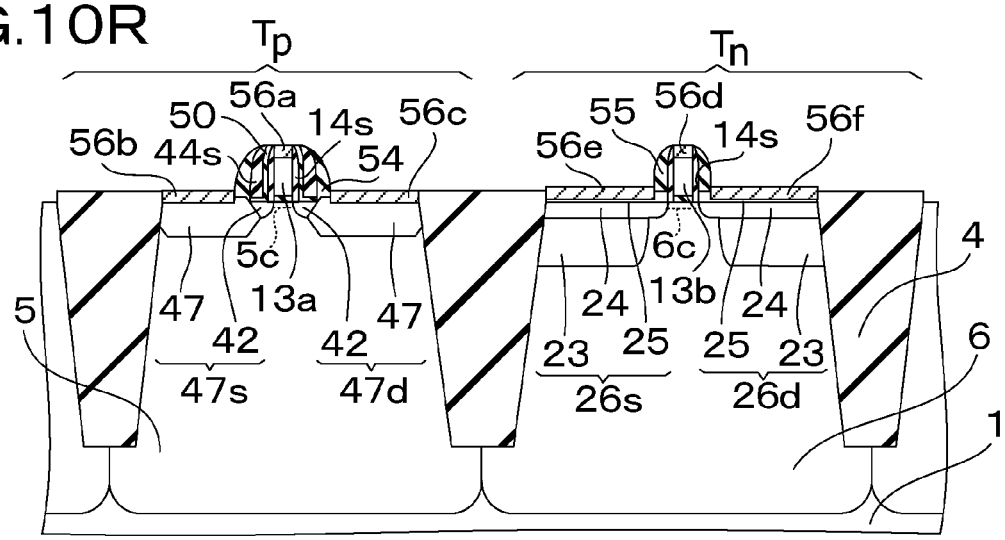

FIGS. 10A to 10R are sectional views illustrating a method for manufacturing a semiconductor device according to a second embodiment.

As in the first embodiment, an n-well 5 and a p-well 6 marked off by STIs 4 are formed on a silicon substrate 1. Subsequently, in the manner described in the first embodiment, first and second gate electrodes 13a and 13b are formed on the n-well 5 and the p-well 6, respectively, with a gate insulating film 7 therebetween.

As in the first embodiment, a silicon nitride film serving as an insulating film 11 is formed on the first and second gate electrodes 13a and 13b.

As illustrated in FIG. 10A, a resist pattern 41 having an opening portion 41a above the n-well 5 and, in addition, covering the p-well 6 is formed on the silicon substrate 1. The first gate electrode 13a is used as a mask, a p-type impurity, for example, boron, is ion-implanted into the n-well 5 through the opening portion 41a and, thereby, p-type extension regions 42 are formed in the n-well 5 on both sides of the first gate electrode 13a. Thereafter, the resist pattern 41 is removed.

As illustrated in FIG. 10B, in the manner described in the first embodiment, insulating side wall spacers 14s are formed on both side surfaces of each of the first and the second gate electrodes 13a and 13b. The side wall spacers 14s are formed from the silicon nitride film 14.

As illustrated in FIG. 10C, a silicon oxide film 43 having a thickness of about 5 nm is formed on the first and the second gate electrodes 13a and 13b, the insulating film 11, the side wall spacers 14s, STIs 4, and the silicon substrate 1 by a CVD method. A silicon nitride film 44 having a thickness of about 20 nm is formed on the silicon oxide film 43 by a plasma CVD method.

A photoresist is applied to the silicon nitride film 44, and this is subjected to exposure, development, and the like, so as to form a resist pattern 45 having an opening portion 45a exposing the silicon nitride film 44 above the p-well 6.

As illustrated in FIG. 10D, the silicon nitride film 44 is etched back through the opening portion 45a of the resist pattern 45 until the silicon oxide film 43 is exposed. Insulating side wall spacers 44s are formed on both side surfaces of the first gate electrode 13a.

The resist pattern 45 and the side wall spacers 44s are used as masks and, thereby, the silicon oxide film 43 exposed above the n-well 5 is removed with hydrofluoric acid. The resist pattern 45 is removed.

As illustrated in FIG. 10E, the side wall spacers 44s, the silicon nitride film 44, the insulating film 11, and the STIs 4 are used as masks, and first recesses 46 having a depth of, for example, about 30 nm are formed in the n-well 5 through plasma etching. For example, a chlorine based gas is used as an etching gas in this case.

As illustrated in FIG. 10F, SiGe films 47 are selectively epitaxially grown on the n-well 5 exposed at the first recesses 46 by the CVD method. In order to form the SiGe film 47, a reaction gas containing, for example, $SiH_4$, $GeH_4$, $H_2$, $B_2H_6$, and HCl is used. Regarding the SiGe film 47, for example, the ratio of the number of Si atoms is 80%, the ratio of the number of Ge atoms is 20% and, therefore, the composition is represented by $Si_{0.8}Ge_{0.2}$.

The extension regions 42 and the SiGe films 47 constitute the source region 47s and the drain region 47d on the two sides of the first gate electrode 13a.

The SiGe film 47 may be formed in, for example, three steps, and after each step, a polycrystalline SiGe film on the insulating film 11, the second side wall spacers 44s, the STIs 4, and the silicon nitride film 44 may be selectively etched by using a chlorine based gas during SiGe epitaxial growth, simultaneously.

As illustrated in FIG. 10G, a resist pattern 48 having a shape covering the n-well 5 and, in addition, exposing the silicon nitride film 44 is formed on the silicon substrate 1. The resist pattern 48 is used as a mask, the silicon nitride film 44 is selectively removed with hot phosphoric acid, and the silicon oxide film 43 is removed with hydrofluoric acid. As illustrated in FIG. 10H, the resist pattern 48 is removed.

A silicon oxide film 49 is formed on the silicon substrate 1. Thereafter, a resist pattern having an opening above the p-well 6 is formed on the silicon substrate 1, and the silicon oxide film 49 on the p-well 6 is removed by using the resist pattern as a mask. As illustrated in FIG. 10I, the resist pattern is removed.

As illustrated in FIG. 10J, the insulating film 11, the side wall spacers 14s, and the silicon oxide film 49 are used as masks, and the p-well 6 is plasma-etched. Second recesses 16 having a depth of, for example, about 10 nm are formed on both sides of the second gate electrode 13b. A chlorine based gas is used as an etching gas in this case. The silicon oxide film 49 is removed with hydrofluoric acid.

As illustrated in FIG. 10K, a silicon oxide film 50 having a thickness of, for example, about 5 nm is formed on the silicon substrate 1 by the CVD method. A silicon nitride film 51 having a thickness of, for example, about 20 nm is formed on the silicon oxide film 50 by the CVD method. A photoresist is applied to the silicon nitride film 51, and this is subjected to exposure and development, so as to form a resist pattern 52 having an opening portion 52a above the p-well 6.

As illustrated in FIG. 10L, the silicon nitride film 51 and the silicon oxide film 50 are etched back through the opening portion 52a of the resist pattern 52 and, thereby, side wall spacers 51s are formed on side surfaces of the second gate electrode 13b. The resist pattern 52 is removed. The side wall spacers 51s have a shape covering the end portions close to the gate electrode 13b of the second recesses 16.

As illustrated in FIG. 10M, the silicon nitride film 51, the STIs 4, the side wall spacers 51s, and the like are used as masks, and the p-well 6 is etched by the plasma etching method. Third recesses 22 having a depth of, for example, about 30 nm are formed on both sides of the second gate electrode 13b. A chlorine based gas is used as an etching gas in this case.

The surfaces of the third recesses 22 may be wet-etched with an organic alkali acid.

As illustrated in FIG. 10N, in the manner described in the first embodiment, first phosphorus-doped $Si_{1-y}C_y$ layers 23 are selectively grown on the p-well 6 in the third recesses 22. The first phosphorus-doped $Si_{1-y}C_y$ layers 23 are formed in, for example, three steps, and after accumulation in each step is completed, a polycrystalline phosphorus-doped $Si_{1-y}C_y$ layer formed on the silicon nitride film 51, the STIs 4, and the like is removed through etching. According to this etching, the film thickness of the single crystal phosphorus-doped $Si_{1-y}C_y$ layer 23 formed on the p-well 6 is reduced by about 5%.

As illustrated in FIG. 10O, a resist pattern 53 covering the silicon nitride film 51 and, in addition, having an opening portion above the p-well 6 is formed on the silicon substrate 1. The silicon nitride film 51 and the silicon oxide film 50 constituting the side wall spacers 51s are removed with hot phosphoric acid and hydrofluoric acid, respectively. Thereafter, the resist pattern 53 is removed.

As illustrated in FIG. 10P, second phosphorus-doped $Si_{1-y}C_y$ layers 24 are selectively grown on the bottom surfaces of the remaining first recesses 16 and on the first phosphorus-doped $Si_{1-y}C_y$ layers 23 up to the position of the lower surface of the gate insulating film 7. Third phosphorus-doped $Si_{1-y}C_y$ layers 25 are formed on the second phosphorus-doped $Si_{1-y}C_y$ layers 24. The second and the third phosphorus-doped $Si_{1-y}C_y$ layers 24 and 25 are formed under the condition described in the first embodiment. The second phosphorus-doped $Si_{1-y}C_y$ layers 24 are bonded to the channel region below the second gate electrode 13b.

The first phosphorus-doped $Si_{1-y}C_y$ layer 23 contains C at a concentration of 2 atomic percent or more, and 2.5 atomic percent or less and contains P at a concentration of more than 0 atomic percent, and 1 atomic percent or less.

The second phosphorus-doped $Si_{1-y}C_y$ layer 24 contains C at a concentration of more than 0 atomic percent, and 1.5 atomic percent or less and contains P at a concentration of more than 0 atomic percent, and 2 atomic percent or less.

The composition of the third phosphorus-doped $Si_{1-y}C_y$ layer 25 is specified to be equal to, for example, the composition of the second phosphorus-doped $Si_{1-y}C_y$ layer 24.

The concentration distributions in the thickness direction of phosphorus and carbon contained in the first, the second, and the third phosphorus-doped $Si_{1-y}C_y$ layers 23, 24, and 25 formed as described above come into the state illustrated in FIG. 2. The concentration of carbon contained in the first phosphorus-doped $Si_{1-y}C_y$ layers 23 is higher than the carbon concentrations of the second and the third phosphorus-doped $Si_{1-y}C_y$ layers 24 and 25. On the other hand, the concentrations of phosphorus contained in the second and the third phosphorus-doped $Si_{1-y}C_y$=layers 24 and 25 are higher than the concentration of phosphorus contained in the first phosphorus-doped $Si_{1-y}C_y$ layers 23.

Here, the first, the second, and the third phosphorus-doped $Si_{1-y}C_y$ layers 23, 24, and 25 formed on one side of the second gate electrode 13b are specified to be a source region 26s, and the first, the second, and the third phosphorus-doped $Si_{1-y}C_y$ layers 23, 24, and 25 formed on the other side are specified to be a drain region 26d. Thereafter, the uppermost silicon nitride film 51 is removed with hot phosphoric acid.

A silicon oxide film is formed on the silicon substrate 1, the silicon oxide film 50, the STIs 4, the side wall spacers 51s, and the like. Thereafter, the resulting silicon oxide film is etched back. Consequently, as illustrated in FIG. 10Q, side wall spacers 54 serving as fourth layers are formed on side surfaces of the first gate electrode 13a and, in addition, side wall spacers 55 serving as second layers are formed on side surfaces of the second gate electrode 13b on the p-well 6.

Steps to form a structure illustrated in FIG. 10R will be described.

The insulating films 11 on the first and the second gate electrodes 13a and 13b are selectively etched and, thereby, the upper surfaces of the first and the second gate electrodes 13a and 13b are exposed.

A nickel film is formed on the first and the second gate electrodes 13a and 13b, the SiGe films 47, the third phosphorus-doped $Si_{1-y}C_y$ layers 25, and the like. Thereafter, the silicon substrate 1 is annealed at a temperature of, for example, 220° C. to 280° C. Nickel and silicon are reacted because of this annealing and, thereby, silicide films 56a to 56f are formed on the first and the second gate electrodes 13a and 13b, the SiGe films 47, and the third phosphorus-doped $Si_{1-y}C_y$ layers 25.

The un-reacted nickel film is removed by using a solution containing sulfuric acid and hydrogen peroxide aqueous solution. The silicide films 56a to 56f are annealed in a temperature range of 300° C. to 500° C. in order to reduce its resistivity by stabilizing its crystal structure.

As in the first embodiment, an etching stop insulating film, an interlayer film, electrically conductive plugs, wirings, and the like are formed.

A PMOS transistor $T_p$ including the n-well 5, the gate insulating film 7, the first gate electrode 13a, the source region 47s, the drain region 47d, and the like is formed through the above-described steps. Furthermore, an NMOS transistor $T_n$ including the p-well 6, the gate insulating film 7, the source region 26s, the drain region 26d, and the like is formed.

In the above-described embodiment, each of the source region 47s and the drain region 47d of the PMOS transistor $T_p$ is formed from the SiGe film 47 and, therefore, a compressive stress is applied to the channel region 5c between them, and the mobility of holes moving in the channel region 5c increases.

As in the first embodiment, each of the source region 26s and the drain region 26d of the NMOS transistor $T_n$ is formed from the first, the second, and the third phosphorus-doped $Si_{1-y}C_y$ layers 23, 24, and 25. Consequently, a tensile stress is applied to the channel region 6c between the source region 26s and the drain region 26d, and the mobility of electrons in the channel region 6c increases.

As in the first embodiment, in the source region 26s and the drain region 26d, the concentration of C contained in the second phosphorus-doped $Si_{1-y}C_y$ layers 24 is lower than the C concentration in the first phosphorus-doped $Si_{1-y}C_y$ layers 23. Consequently, the energy barrier at the interface between the channel region 6c and the second phosphorus-doped $Si_{1-y}C_y$ layers 24 is low. The first phosphorus-doped $Si_{1-y}C_y$ layers 23 have a high C concentration and is formed having a large thickness, so that a large tensile stress is applied to the channel region 6c.

As in the first embodiment, the concentration of P contained in the second phosphorus-doped $Si_{1-y}C_y$ layers 24 is higher than the P concentration in the first phosphorus-doped $Si_{1-y}C_y$ layers 23. Consequently, the electrical conductivities on both sides of the channel region increase and the tensile stress due to C increases with the assistance of P.

On account of them, electrons are injected from the channel region 6c into the drain region 26d easily.

FIGS. 11A to 11H are sectional views illustrating a method for manufacturing a semiconductor device according to a third embodiment.

As in the first embodiment, an n-well 5 and a p-well 6 marked off by STIs 4 are formed on a silicon substrate 1. In the manner described in the first embodiment, first and second gate electrodes 13a and 13b are formed on the n-well 5 and the p-well 6, respectively, with a gate insulating film 7 therebetween. A silicon oxide film serving as an insulating film 11 is formed on the first and second gate electrodes 13a and 13b.

Figure 11A:
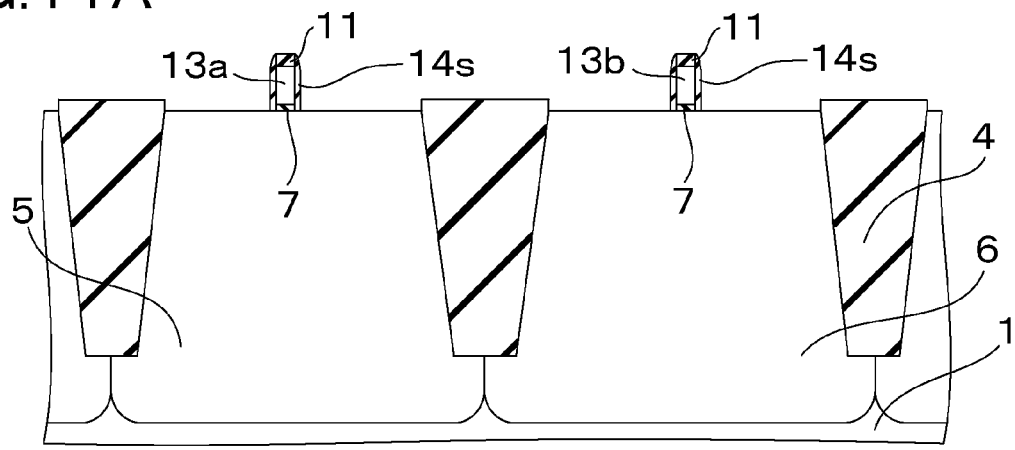
FIGS. 11A to 11H are sectional views illustrating steps of forming a semiconductor device according to a third embodiment.

A silicon nitride film is formed on the first and the second gate electrodes 13a and 13b and the silicon substrate 1. As illustrated in FIG. 11A, the silicon nitride film is etched back and, thereby, side wall spacers 14s composed of the silicon nitride film are formed on side surfaces of the first and the second gate electrodes 13a and 13b.

Figure 11B:
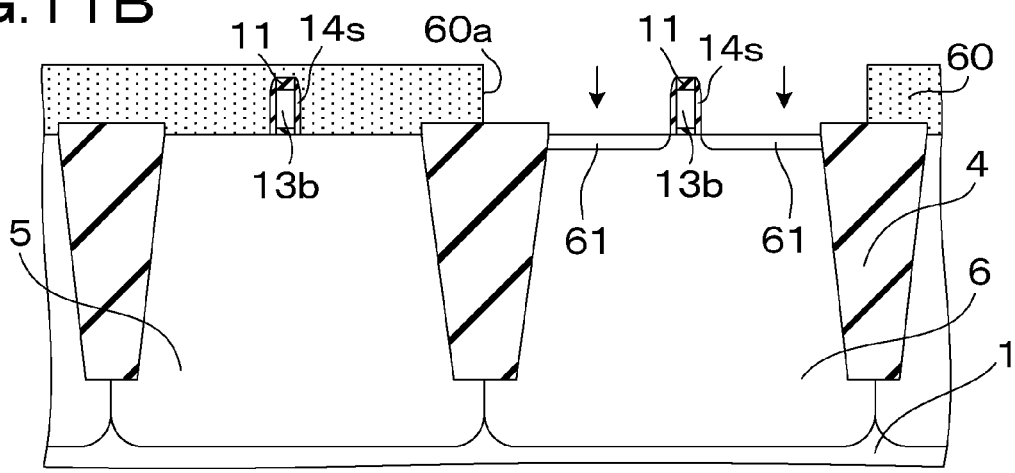

A photoresist is applied to the silicon substrate 1, and this is exposed and developed. As illustrated in FIG. 11B, a resist pattern 60 having an opening portion 60a above the p-well 6 is formed.

The resist pattern 60, the side wall spacers 14s, and the second gate electrode 13b are used as masks and Ge is ion-implanted into the p-well 6. Ion implantation of C into the p-well 6 is conducted through the opening portion 60a and, thereafter, P is ion-implanted.

Ion implantation of Ge is conducted in order to facilitate ion implantation of elements into the silicon substrate 1 in downstream steps.

As for the Ge ion implantation condition, for example, the acceleration energy is specified to be 15 keV and the dosage is specified to be $3\times10^{14}$ cm$^{-2}$. As for the C ion implantation condition, for example, the acceleration energy is specified to be 3 keV and the dosage is specified to be $2\times10^{15}$ cm$^{-2}$. As for the P ion implantation condition, for example, the acceleration energy is specified to be 2 keV and the dosage is specified to be $1\times10^{16}$ cm$^{-2}$.

First phosphorus-doped silicon carbide regions 61 containing carbon at a first concentration and containing phosphorus at a second concentration, for example, $1\times10^{21}$/cm$^3$ or less, are formed as surface layers of the p-well 6 on both sides of the second gate electrode 13b. The first phosphorus-doped $Si_{1-y}C_y$ regions 61 are bonded to channel region 6c under the second gate electrode 13b.

Figure 11C:
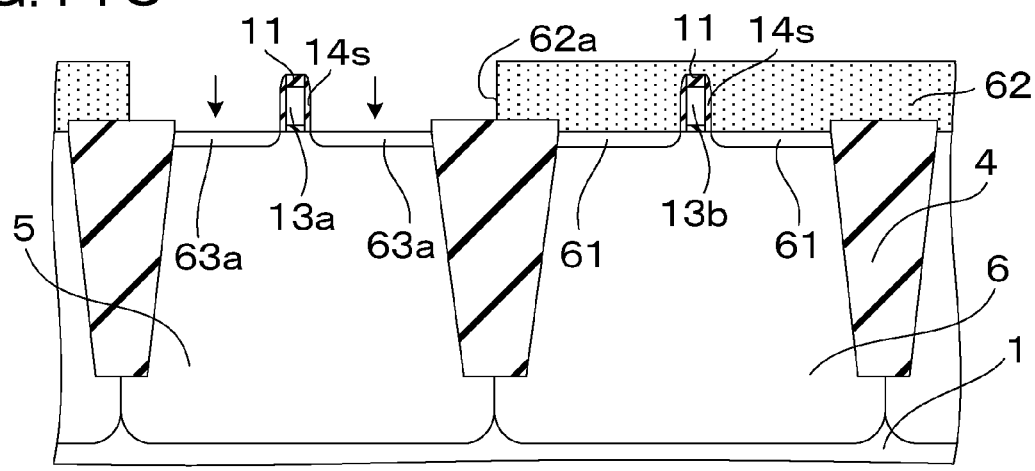

After the resist pattern 60 is removed, a fresh photoresist is applied to the silicon substrate 1, and exposure and development are conducted, so that, as illustrated in FIG. 11C, a resist pattern 62 having an opening portion 62a is formed above the n-well 5.

The resist pattern 62, the side wall spacers 14s, and the first gate electrode 13a are used as masks and Ge is ion-implanted into the n-well 5. Subsequently, boron fluoride ions ($BF^{2+}$) are implanted into the n-well 5.

As for the Ge ion implantation condition, for example, the acceleration energy is specified to be 20 keV and the dosage is specified to be $5\times10^{14}$ cm$^{-2}$. Furthermore, as for the $BF^{2+}$ implantation condition, for example, the acceleration energy is specified to be 1 keV and the dosage is specified to be $1\times10^{15}$ cm$^{-2}$. Extension regions 63a having a low impurity concentration are formed as upper layers of the n-well 5 on both sides of the first gate electrode 13a.

After the resist pattern 62 is removed, the silicon substrate 1 is annealed for a short time of 1 to 10 milliseconds. As for the annealing, for example, a flash lamp or a laser is used. The n-well 5 and the p-well 6 are recrystallized and, in addition, C and P are led to crystal lattice positions in the phosphorus-doped silicon carbide regions 61 through this annealing. Furthermore, B introduced into the n-well 5 is activated.

Figure 11D:
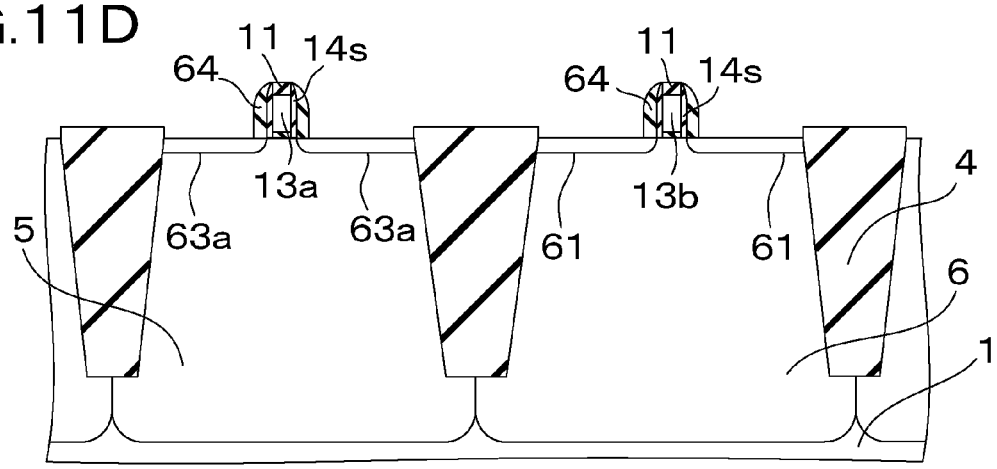

A silicon nitride film covering the first and the second gate electrodes 13a and 13b and the first side wall spacers 14s is formed on the silicon substrate 1. As illustrated in FIG. 11D, the silicon nitride film is etched back and, thereby, side wall spacers 64 serving as the second layer are formed beside the first and the second gate electrodes 13a and 13b.

The side wall spacers 64 serving as the second layers are formed by, for example, a plasma CVD method at a temperature of 500° C. or lower. A gas containing silane and ammonia is used as a reaction gas for the plasma CVD. In this regard, the frequency of the electric power applied to the electrode in a plasma CVD device is specified to be 2.46 GHz and the power is specified to be 3,000 W.

Figure 11E:
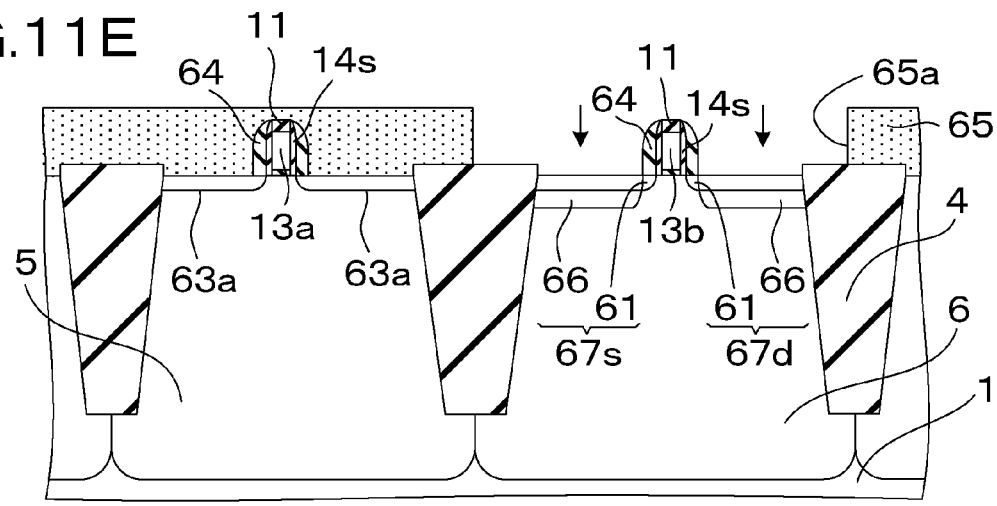

A photoresist is applied on the silicon substrate 1, and exposure and development are conducted. As illustrated in FIG. 11E, a resist pattern 65 having an opening portion 65a above the p-well 6 is formed.

The resist pattern 65, the second gate electrode 13b, and the side wall spacers 14s and 64 are used as masks and Ge is ion-implanted into the p-well 6 through the opening portion 65a. Ion implantation of C into the p-well 6 is conducted through the opening portion 65a and, thereafter, P is ion-implanted.

As for the Ge ion implantation condition, for example, the acceleration energy is specified to be 20 keV and the dosage is specified to be $5\times10^{14}$ cm$^{-2}$. As for the C ion implantation condition, for example, the acceleration energy is specified to be 5 keV and the dosage is specified to be $2\times10^{15}$ cm$^{-2}$. As for the P ion implantation condition, for example, the acceleration energy is specified to be 6 keV and the dosage is specified to be $8\times10^{15}$ cm$^{-2}$.

Second phosphorus-doped $Si_{1-y}C_y$ regions 66 are formed in the p-well 6 outside the second gate electrode 13b and the side wall spacers 64 and under the first phosphorus-doped $Si_{1-y}C_y$ regions 61. The phosphorus concentration in the second phosphorus-doped $Si_{1-y}C_y$ regions 66 is lower than the above-described second concentration of phosphorus. Furthermore, the phosphorus concentration and the carbon concentration of the regions, in which the first phosphorus-doped $Si_{1-y}C_y$ regions 61 and the second phosphorus-doped $Si_{1-y}C_y$ regions 66 overlap one another, are higher than those of the first and the second phosphorus-doped silicon carbide regions 61 and 66.

In ion implantation of C for forming the second phosphorus-doped $Si_{1-y}C_y$ regions 66, not only the acceleration energy, but also the dosage may be higher as compared with the condition of formation of the first phosphorus-doped $Si_{1-y}C_y$ regions 61. According to this, the carbon concentration of the second phosphorus-doped $Si_{1-y}C_y$ regions 66 under the first phosphorus-doped $Si_{1-y}C_y$ regions 61 becomes higher than the first concentration at the end portions of the first phosphorus-doped $Si_{1-y}C_y$ regions 61 under the side wall spacers 64.

The first and the second phosphorus-doped $Si_{1-y}C_y$ regions 61 and 66 on one side of the second gate electrode 13b constitute a source region 67s, and the first and the second phosphorus-doped $Si_{1-y}C_y$ regions 61 and 66 on the other side of the second gate electrode 13b constitute a drain region 67d.

Figure 11F:
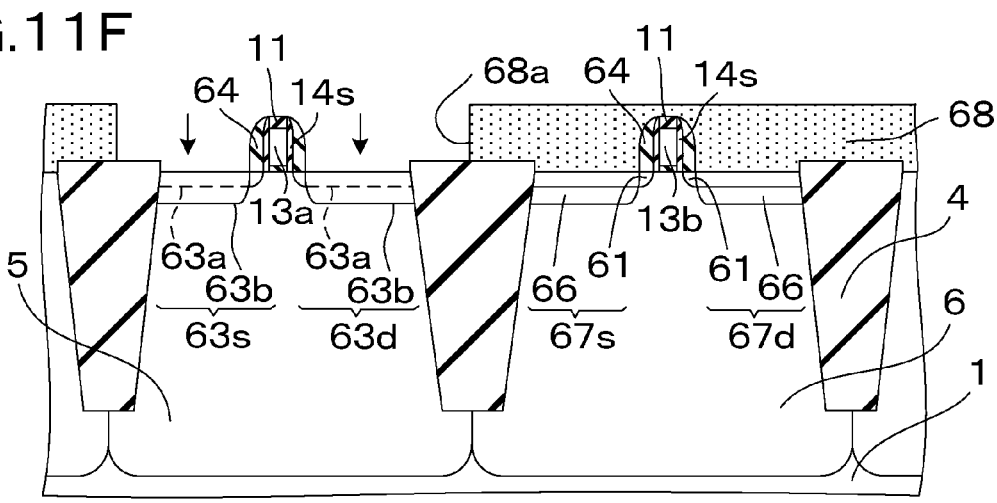

After the resist pattern 65 is removed, a fresh photoresist is applied to the silicon substrate 1, and exposure and development are conducted, so that, as illustrated in FIG. 11F, a resist pattern 68 covering the p-well 6 and having an opening portion 68a above the n-well 5 is formed.

The resist pattern 68, the first gate electrode 13a, and the side wall spacers 14s and 64 are used as masks and Ge is ion-implanted into the n-well 5. Boron fluoride ions ($BF^{2+}$) are implanted into the n-well 5 through the opening portion 68a.

As for the Ge ion implantation condition, for example, the acceleration energy is specified to be 20 keV and the dosage is specified to be $5\times10^{14}$ cm$^{-2}$. Furthermore, as for the $BF^{2+}$ implantation condition, for example, the acceleration energy is specified to be 1 keV and the dosage is specified to be $6\times10^{15}$ cm$^{-2}$.

In the n-well 5, p-type impurity diffusion regions 63b having a high impurity concentration are formed on both sides of the regions, in which the first gate electrode 13a and the side wall spacers 64 are formed. The p-type impurity diffusion regions 63b overlap a part of the p-type extension regions 63a.

One each of the p-type extension regions 63a and the p-type impurity diffusion regions 63b in the two regions constitute a source region 63s and the others constitute a drain region 63d.

Figure 11G:
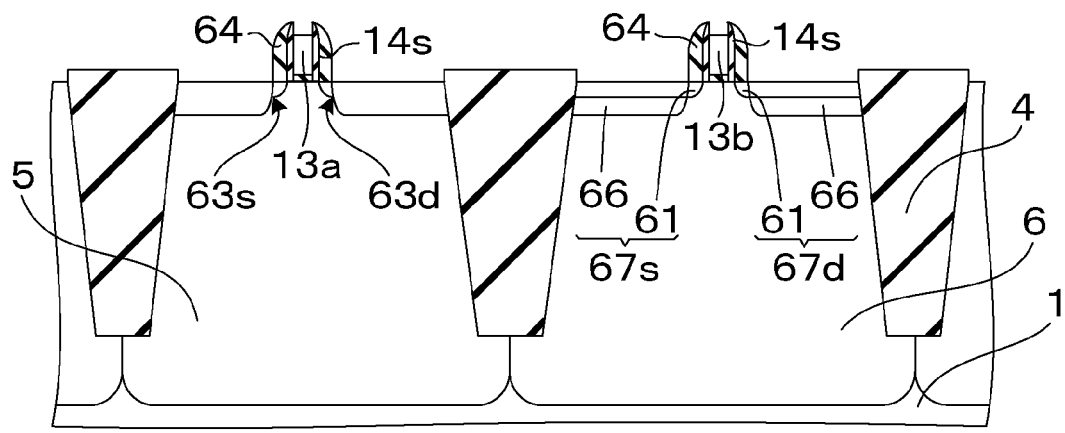

After the resist pattern 68 is removed, as illustrated in FIG. 11G, the insulating films 11 composed of the silicon oxide film on the gate electrodes 13a and 13b are removed with hydrofluoric acid.

After the insulating films 11 are removed, the silicon substrate 1 is rapid-annealed for a short time of the order of milliseconds. As for the annealing, for example, a flash lamp or a laser is used. In the case where the flash is used, light is emitted in a period of 1 ms with a discharge voltage of 4,000 V. In the case where the laser is used, laser light of 1,200° C. in terms of a maximum temperature is applied in a period of 1 ms with an output of 2,000 W.

The n-well 5 and the p-well 6 are recrystallized, and C and P are led to crystal lattice positions in the second phosphorus-doped $Si_{1-y}C_y$ regions 66 and regions thereon. Furthermore, B introduced into the n-well 5 is activated.

A metal film, for example, a nickel film, is formed on the silicon substrate 1, the first and the second gate electrodes 13a and 13b, the source regions 63s and 67s, the drain regions 63d and 67d, and the like. Thereafter, the silicon substrate 1 and the metal film are annealed under the same condition as that in the first embodiment. The un-reacted metal film is removed.

Figure 11H:
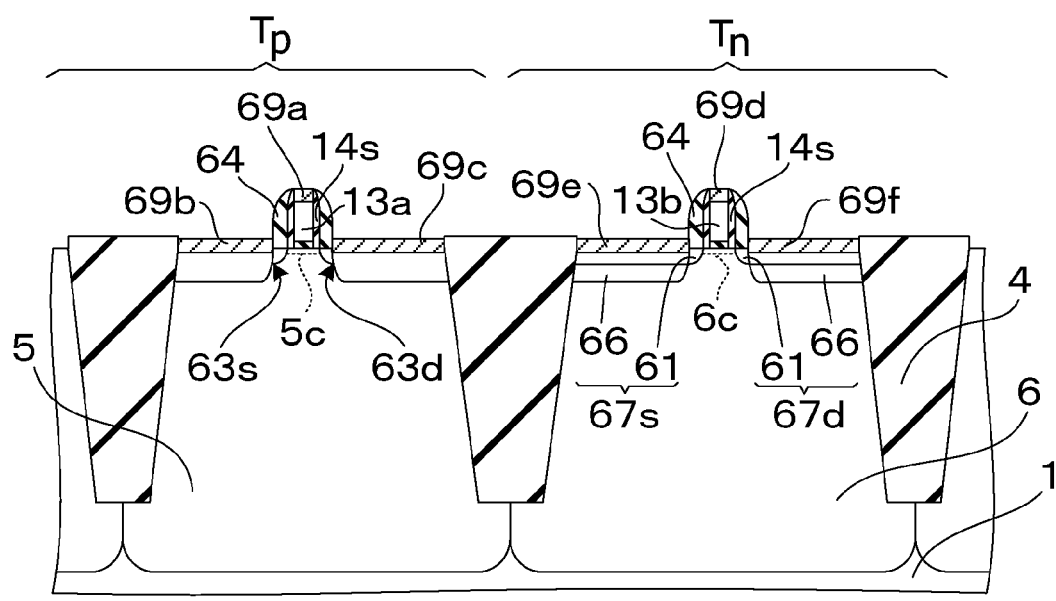

As illustrated in FIG. 11H, silicide layers 69a to 69f are formed on the first and the second gate electrodes 13a and 13b, the source regions 63s and 67s, and the drain regions 63d and 67d.

As in the first embodiment, an etching stop insulating film, an interlayer film, electrically conductive plugs, wirings, and the like are formed.

In this manner, a PMOS transistor $T_p$ including the n-well 5, the gate insulating film 7, the first gate electrode 13a, the source region 63s, the drain region 63d, and the like is formed. An NMOS transistor $T_n$ including the p-well 6, the gate insulating film 7, the second gate electrode 13b, the source region 67s, the drain region 67d, and the like is formed.

In the above-described embodiment, carbon is contained in the source region 67s and the drain region 67d of the NMOS transistor $T_n$. Therefore, a tensile stress is applied to the channel region 6c between those regions, and the mobility of electrons in the channel region 6c increases. As in the first embodiment, phosphorus contained in the source region 67s and the drain region 67d assists the tensile stress due to carbon.

Regarding the end portions of the source region 67s and the drain region 67d, the phosphorus concentration is high in the portion bonded to the channel region 6c. As in the first embodiment, degeneracy of the conductive band of the energy band gap occurs because of phosphorus and, therefore, the energy barrier is reduced.

In the case where the carbon concentration at the end portions close to the second gate electrode 13b in the first phosphorus-doped silicon carbide regions 61 is specified to be 1.5 atomic percent or less, as in the first embodiment, an effect of band offset is reduced and the energy barrier is reduced.

Since the phosphorus concentration of the first phosphorus-doped $Si_{1-y}C_y$ regions 61 is high, the resistance is reduced at the end portions thereof, so that electrons are injected from the channel region 6c into the drain region 67d easily.

In the case where the carbon concentrations of the second phosphorus-doped $Si_{1-y}C_y$ regions 66 serving as lower layer portions of each of the source region 67s and the drain region 67d are specified to be higher than that of the first phosphorus-doped silicon carbide regions 61, the tensile stress of the channel region 6c increases.

It becomes possible to reduce the resistance values of the source region 67s and the drain region 67d while strain is applied to the channel region 6c by the source region 67s and the drain region 67d and, thereby, facilitate electron injection of the drain region 67d with respect to the channel region 6c.

As is described in the first embodiment, regarding the NMOS transistor $T_n$, the lattice constant of the pseudo-diamond lattice calculated through conversion from the covalent bond radius of phosphorus is 0.493 nm and is smaller than the lattice constant of silicon of 0.543 nm.

Therefore, the value of mixed crystal lattice constant of the phosphorus-doped $Si_{1-y}C_y$ layer in a relaxed state becomes smaller than that of the silicon layer reliably. The results of analysis based on Raman spectroscopy will be described below.

Figure 12A:
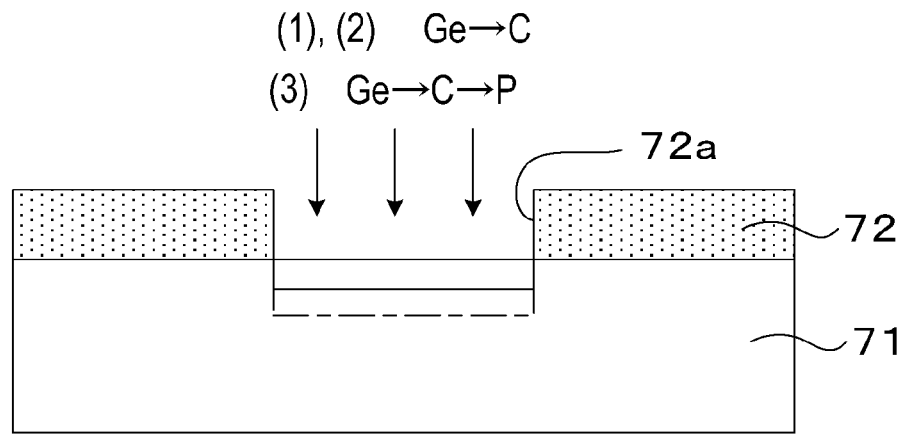
FIG. 12A is a sectional view illustrating methods for ion-implanting carbon and ion-implanting phosphorus into a silicon layer used for semiconductor devices according to the first, the second, and the third embodiments.

As illustrated in FIG. 12A, a mask 72 having an opening portion 72a is formed on a single crystal silicon layer 71, and in that state, Ge is ion-implanted into the single crystal silicon layer 71 through the opening portion 72a under the condition of the acceleration energy of 20 keV and the dosage of $5 \times 10^{14}$ cm$^{-2}$, so as to break the mother crystal of the silicon layer. Consequently, entrance of carbon and phosphorus into the silicon layer 71 is facilitated. A plurality of samples of ion-implanted silicon layer 71 are formed and, thereafter, carbon or carbon and phosphorus are ion-implanted into the region ion-implanted with Ge under the following condition.

As for a first condition, as illustrated in FIG. 12A (1), carbon is ion-implanted into the silicon layer 71 under the condition of the acceleration energy of 4 keV and the dosage of $3 \times 10^{15}$ cm$^{-2}$. As for a second condition, as illustrated in FIG. 12A (2), carbon is ion-implanted into the silicon layer under the condition of the acceleration energy of 4 keV and the dosage of $6 \times 10^{15}$ cm$^{-2}$. As for a third condition, as illustrated in FIG. 12A (3), carbon is ion-implanted into the silicon layer under the condition of the acceleration energy of 4 keV and the dosage of $6 \times 10^{15}$ cm$^{-2}$ and, furthermore, phosphorus is ion-implanted into the silicon layer under the condition of the acceleration energy of 6 keV and the dosage of $1.2 \times 10^{16}$ cm$^{-2}$.

Figure 12B:
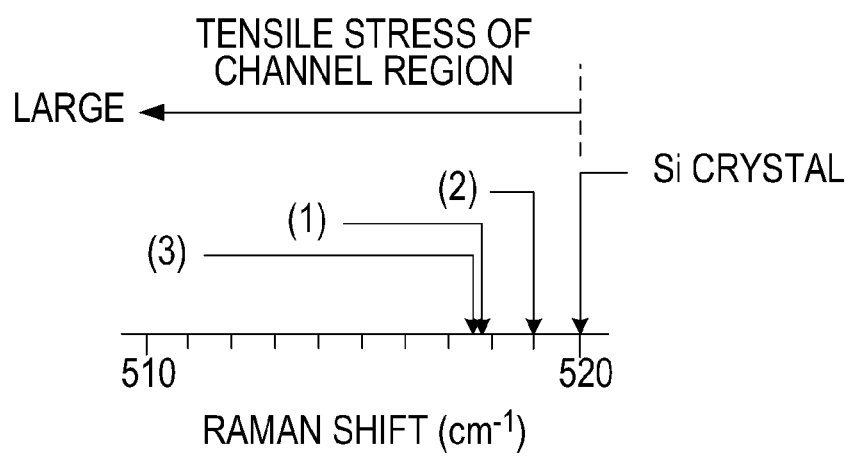
FIG. 12B is a diagram illustrating the results of analysis of silicon compounds through Raman spectroscopy, where ion-implantation conditions of carbon and phosphorus into a silicon layer used for semiconductor devices according to the embodiments of the present invention are different.

After the first, the second, and the third ion implantation, the silicon layers 71 were activated through a rapid heat treatment. Regarding each silicon layer 71 after activation, the Raman shift value was examined through UV laser Raman spectroscopy, and the peak of the Raman shift was analyzed, so as to obtain the results illustrated in FIG. 12B.

In the case where a single crystal silicon layer 71 at an initial stage was measured through UV laser Raman spectroscopy, the Raman shift was 520 cm$^{-1}$.

The value of Raman shift of the silicon layer 71 after ion implantation under the first condition was 517 cm$^{-1}$ to 518 cm$^{-1}$ and, therefore, it is clear that strain occurred. On the other hand, the value of Raman shift of the silicon layer 71 after ion implantation under the second condition was 519 cm$^{-1}$. Consequently, the strain applied to the silicon layer 71 was relieved because of an excess dose, and proximity to the Raman shift value of the silicon layer 71 increased.

On the other hand, the value of Raman shift of the silicon layer 71 after ion implantation under the third condition was 517 cm$^{-1}$ to 518 cm$^{-1}$. This refers to carbon and phosphorus entered certain positions of the crystal lattice favorably because of phosphorus ion implantation.

It is clear that introduction of phosphorus and carbon into the silicon layer 71 has an effect of adding strain to the above-described channel region 6c.

Each of the silicon layer, the $Si_{1-y}C_y$ layer, and the phosphorus-containing $Si_{1-y}C_y$ layer is measured through UV Raman spectroscopy, and the same results as those illustrated in FIG. 9 described in the first embodiment are obtained.

As the carbon concentration increases, the Raman shift becomes small, and tensile strain applied to the silicon layer becomes small. In the case where 2 atomic percent of carbon and phosphorus at a concentration of 1 atomic percent are contained into the silicon layer, the Raman shift increases as compared with that in the case where phosphorus is not contained and a tensile stress applied to the silicon layer further increases.

Addition of phosphorus has an effect of increasing strain generated in the silicon film because of carbon.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A semiconductor device comprising:
   a gate insulating film over a semiconductor substrate;
   a gate electrode over the gate insulating film;
   a channel region in the semiconductor substrate; and
   a source electrode and a drain electrode in the semiconductor substrate,
   wherein each of the source electrode and the drain electrode includes a first carbon doped silicon layer including carbon at a first carbon concentration and phosphorus at a first phosphorus concentration and a second carbon doped silicon layer over the first carbon doped silicon layer and in contact with the channel region, the second carbon doped silicon layer includes phosphorus at a second phosphorus concentration higher than the first phosphorus concentration and includes carbon at a second carbon concentration less than the first carbon concentration and,
   wherein a third carbon doped silicon layer is provided between the second carbon doped silicon layer and a sidewall spacer for the gate electrode and an upper surface of at least a portion of the third carbon doped silicon layer directly underlies the sidewall spacer.

2. The semiconductor device according to claim 1, wherein the second carbon doped silicon layer is disposed in a pair of first concave portions, located in the semiconductor substrate and sandwiching the channel region, the first carbon doped silicon layer is disposed in second concave portions, which are disposed in the semiconductor substrate and in contact with the first concave portions, and the second concave portions are deeper than the first concave portions.

3. The semiconductor device according to claim 1, wherein the first carbon concentration is 2.0 atomic percent or more and the second carbon concentration is 1.5 atomic percent or less.

4. The semiconductor device according to claim 1, wherein the first phosphorus concentration is 1.0 atomic percent or more and the second phosphorus concentration is 2.0 atomic percent or less.

5. The semiconductor device according to claim 1, wherein an end portion of the second carbon doped silicon layer is nearer to the channel region than is an end portion of the first carbon doped silicon layer.

6. The semiconductor device according to claim 1 further comprising: side wall spacers on side surfaces of the gate electrode.

7. The semiconductor device according to claim 1, wherein the first carbon doped silicon layer is thicker than the second silicon carbide layer.

8. The semiconductor device according to claim 1, wherein the third carbon doped silicon layer over the second carbon doped silicon layer, which includes phosphorus at a third phosphorus concentration higher than the first phosphorus concentration, and which includes carbon at a third carbon concentration less than or equal to the first carbon concentration.

9. A semiconductor device comprising:
a gate insulating film over a semiconductor substrate;
a gate electrode over the gate insulating film;
a channel region in the semiconductor substrate; and
a source electrode and a drain electrode in the semiconductor substrate,
wherein each of the source electrode and the drain electrode includes a first carbon doped silicon layer including carbon at a first carbon concentration and phosphorus at a first phosphorus concentration, a second carbon doped silicon layer over the first carbon doped silicon layer and in contact with the channel region, the second carbon doped silicon layer includes phosphorus at a second phosphorus concentration higher than the first phosphorus concentration and includes carbon at a second carbon concentration less than or equal to the first carbon concentration,
wherein the first phosphorus concentration is 1.0 atomic percent or more and the second phosphorus concentration is 2.0 atomic percent or less.

10. A semiconductor device comprising:
a gate insulating film over a semiconductor substrate;
a gate electrode over the gate insulating film;
a channel region in the semiconductor substrate; and
a source electrode and a drain electrode in the semiconductor substrate,
wherein each of the source electrode and the drain electrode includes a first carbon doped silicon layer including carbon at a first carbon concentration and phosphorus at a first phosphorus concentration and a second carbon doped silicon layer over the first carbon doped silicon layer and in contact with the channel region, the second carbon doped silicon layer includes phosphorus at a second phosphorus concentration higher than the first phosphorus concentration and includes carbon at a second carbon concentration less than or equal to the first carbon concentration and,
wherein a third carbon doped silicon layer is provided between the second carbon doped silicon layer and a sidewall spacer for the gate electrode,
wherein the first phosphorus concentration is 1.0 atomic percent or more and the second phosphorus concentration is 2.0 atomic percent or less.

* * * * *